United States Patent [19]
Onakado et al.

[11] Patent Number: 6,014,328
[45] Date of Patent: Jan. 11, 2000

[54] MEMORY CELL ALLOWING WRITE AND ERASE WITH LOW VOLTAGE POWER SUPPLY AND NONVOLATILE SEMICONDUCTOR MEMORY DEVICE PROVIDED WITH THE SAME

[75] Inventors: Takahiro Onakado; Natsuo Ajika, both of Hyogo, Japan

[73] Assignee: Mitsubishi Denki Kabushiki Kaisha, Tokyo, Japan

[21] Appl. No.: 09/035,786

[22] Filed: Mar. 6, 1998

[30] Foreign Application Priority Data

Sep. 5, 1997 [JP] Japan .................................... 9-241354

[51] Int. Cl.$^7$ .................................................. G11C 16/04
[52] U.S. Cl. ................................ 365/185.05; 365/185.17
[58] Field of Search ........................ 365/185.05, 185.17, 365/185.26; 257/316, 315, 326

[56] References Cited

U.S. PATENT DOCUMENTS

| | | | |
|---|---|---|---|
| 4,442,510 | 4/1984 | Priel et al. | 365/185.26 |
| 5,471,422 | 11/1995 | Chang et al. | 365/185.26 |
| 5,576,989 | 11/1996 | Kowalski | 365/185.26 |
| 5,592,001 | 1/1997 | Asano | 365/185.05 |

FOREIGN PATENT DOCUMENTS 9-8153  1/1997  Japan .

OTHER PUBLICATIONS

"A High Density Floating–Gate EEPROM Cell," J.R. Yeargain, et al., IEDM 81, pp. 24–27.

*Primary Examiner*—David Nelms
*Assistant Examiner*—VanThu Nguyen
*Attorney, Agent, or Firm*—McDermott, Will & Emery

[57] ABSTRACT

In a nonvolatile semiconductor memory device, a memory cell array includes memory cell transistors and cell select transistors corresponding to the memory cell transistors, respectively. A memory cell SG decoder supplies a potential to a cell select line corresponding to the selected row. The cell select transistor opens and closes a conduction path of a current flowing between a bit line and a source line through the memory cell transistor in accordance with the potential on the cell select line. As a result, an influence by a leak current flowing from the unselected memory cell transistor in a read operation is suppressed.

3 Claims, 36 Drawing Sheets

|  | Vcg | Vsg | Vs | Vd | Vwell |
|---|---|---|---|---|---|
| STANDBY | 1.8V | 0V | 0V | 0V | 0V |
| READ | 1.8V | 1.8V | 0V | 1~1.8V | 0V |

FIG.22

| BIT LINE PARASITIC CAPACITY | (x1) | ~1pF |
|---|---|---|
| DIFFUSION LAYER CAPACITY OF MEMORY CELL TRANSISTOR | (x2) | 2fF/cell |
| NUMBER OF MEMORY CELLS ON BIT LINE | (x3) | 2000cell |
| x2✕x3÷2 | (x4) | 2pF |
| BIT LINE CAPACITY CB0 | (=x1+x4) | 3pF |

FIG.24

| | | |
|---|---|---|
| MAIN BIT LINE PARASITIC CAPACITY | (x5) | 1pF |
| SUB-BIT LINE PARASITIC CAPACITY | (x6) | ~0.05pF |
| NUMBER OF MEMORY CELLS ON SUB-BIT LINE | (x8) | 64cell |
| DIFFUSION LAYER CAPACITY OF MEMORY CELL TRANSISTOR | (x7) | 2fF/cell |
| x7×x8÷2 | (x9) | 0.06pF |
| TRANSISTOR CAPACITY OF SELECT GATE | (x10) | ~0.2pF |
| BIT LINE CAPACITY CB1 (=x5+x6+x9+x10) | | 1.3pF |

FIG.25

|  | Vcg | Vsg | Vs | Vd | Vwell |  |
|---|---|---|---|---|---|---|
| STANDBY | 0V | 0V | 0V | 0V | 0V |  |
| READ | 0V | 1.8V | 0V | 1~1.8V | 0V |  |
| WRITE | -10V | 6V | open | 5V | 0V |  |
| ERASE | 10V | 0~-8V | -8V | open | -8V | WELL DIVISION |
|  | 18V | 0V | 0V | open | 0V | NO WELL DIVISION |

FIG.26

|  | Vcg | Vsg | Vs | Vd | Vwell |  |
|---|---|---|---|---|---|---|
| STANDBY | 0V | 0V | 0V | 0V | 0V |  |
| READ | 0V | 1.8V | 0V | 1V | 0V |  |
| WRITE | -10V | 0V | open | 5V | 0V |  |
| ERASE | 10V | 0~-8V | -8V | open | -8V | WELL DIVISION |
|  | 18V | 0V | 0V | open | 0V | NO WELL DIVISION |

FIG.35

| Tox | Vd | Vcg | WRITE SPEED |
|---|---|---|---|
| 100 Å | 6V | -10V | ~500 μs |

FIG.36

| Tox | Vd | Vcg | WRITE SPEED |
|---|---|---|---|
| 100 Å | -4.5V | 10V | ~500 μs |

| Tox | Vd | Vcg | WRITE SPEED |
|---|---|---|---|
| 100 Å | -6V | 6V | ~500 μs |

|  | Vcg | Vsg | Vs | Vd | Vwell |  |
|---|---|---|---|---|---|---|
| STANDBY | 0V | 0V | 0V | 0V | 0V |  |
| READ | 0V | -1.8V | 0V | -1~-1.8V | 0V |  |
| WRITE | 10V | -6V | open | -5V | 0V |  |
| ERASE | -10V | 0~8V | 8V | open | 8V | WELL DIVISION |
|  | -18V | 0V | 0V | open | 0V | NO WELL DIVISION |

FIG.40

|  | Vcg | Vsg | Vs | Vd | Vwell |  |
|---|---|---|---|---|---|---|
| STANDBY | 0V | 0V | 0V | 0V | 0V |  |
| READ | 0V | -1.8V | 0V | -1V | 0V |  |
| WRITE | 10V | 0V | open | -5V | 0V |  |
| ERASE | -10V | 0~8V | 8V | open | 8V | WELL DIVISION |
|  | -18V | 0V | 0V | open | 0V | NO WELL DIVISION |

FIG.41 ex. Vcc=1.8V

|  | Vcg | Vsg | Vs | Vd | Vwell |
|---|---|---|---|---|---|
| STANDBY | ARBITRARY | 1.8V | 1.8V | 1.8V | 1.8V |
| READ | ARBITRARY | 0V | 1.8V | 0~1V | 1.8V |

MEMORY CELL ALLOWING WRITE AND ERASE WITH LOW VOLTAGE POWER SUPPLY AND NONVOLATILE SEMICONDUCTOR MEMORY DEVICE PROVIDED WITH THE SAME

BACKGROUND OF THE INVENTION

1. Field of the Invention

The present invention relates to a memory cell and a nonvolatile semiconductor memory device provided with the same, and in particular to a memory cell allowing write and erase with a low voltage power supply as well as a nonvolatile semiconductor memory device provided with the memory cell.

2. Description of the Background Art

Recently, a flash memory which is a kind of nonvolatile semiconductor memory device has been expected as a memory device on the next generation because it can be manufactured at a lower cost than a dynamic random access memory (DRAM).

A memory cell array of a nonvolatile semiconductor memory device in the prior art will now be described below with reference to FIG. 43. A memory cell array 1000 of a NOR-type flash memory shown in FIG. 43 is provided with a plurality of word lines WL and a plurality of bit lines BL. FIG. 43 representatively shows only word lines WL1, WL2, WL3, . . . and bit lines BL1, BL2, BL3, . . . A memory cell MC is arranged at each of crossings between word lines WL and bit lines BL. The memory cell MC is formed of a MOS transistor of a floating type.

A structure of the memory cell transistor forming the memory cell will now be described below with reference to FIG. 44.

As shown in FIG. 44, the memory cell transistor includes an n-type source region 2 and an n-type drain region 3 which are formed at a main surface of a p-type semiconductor substrate 1, a floating gate electrode 5 which is formed on a channel region defined between source and drain regions 2 and 3 with a tunnel oxide film 4 therebetween, and a control gate electrode 7 formed on floating gate electrode 5 with an insulating film 6 therebetween. Source and drain regions 2 and 3 of each memory cell transistor are formed by ion implantation using a mask which is formed of a side wall insulating film 9 formed on side walls of floating gate electrode 5 and control gate electrode 7.

Referring to FIGS. 43 and 44, a source line SL is connected to source region 2 in each memory cell. Bit line BL is connected to drain region 3. Word line WL is connected to control gate electrode 7. A conductance between the source and drain varies depending on the potential applied to control gate electrode 7. A current starts to flow between the source and drain when the potential on control gate electrode 7 increases to a certain value, which is called a threshold. The threshold increases with increase in quantity of electrons accumulated in floating gate electrode 5.

The memory cell transistor stores information by changing the charged state of floating gate electrode 5. Since floating gate electrode 5 is electrically isolated from the surrounding by the insulating film, information is stored in a nonvolatile manner.

Read, write and erase operations of the NOR-type flash memory will be briefly described below.

In the write operation, electrons are injected into the floating gate electrode by channel hot electron injection. Thereby, a threshold voltage Vth of the memory cell transistor changes from a lower threshold side to a higher threshold side.

In the erase operation, electrons are extracted from a FN (Fowler-Nordheim) tunnelling phenomenon at a gate edge of the source or drain. Thereby, threshold voltage Vth changes from the higher threshold side to the lower threshold side.

In the read operation, a voltage of about 1 volt is applied to selected bit line BL, and an external power supply voltage Vcc is applied to selected word line WL so that information is read out depending on whether a current flows between the source and drain of the memory cell transistor located at the crossing between selected word line WL and selected bit line BL.

A threshold voltage distribution of the NOR-type flash memory will now be described below with reference to FIGS. 45 and 46. In NOR-type flash memory, as shown in FIG. 45, a state that threshold voltage Vth is higher than external power supply voltage Vcc (5 V) is called a written state, and a state that threshold voltage Vth is lower than external power supply voltage Vcc (5 V) is called an erased state.

In the NOR-type flash memory, writing is effected on one bit at a time, and erasing is effect on all the bits at a time. Therefore, the threshold voltage distribution in the erased state is wider than the threshold voltage distribution in the written state.

As shown in FIG. 46, when using external power supply voltage Vcc of 3.3 V, which is now widely used, a so-called overerased cell, in which threshold voltage Vth takes on the value of 1.5 V or less, appears.

A problem caused by the overerased cell in the flash memory will be described below with reference to FIG. 47. As shown in FIG. 47, it is assumed that data is to be read from memory cell MC1 connected to bit line BL, and memory cells MC2, MC3, MC4, . . . connected to the same bit line BL are overerased cells. For reading data from memory cell MC1, a voltage of about 1 V is applied to bit line BL. Further, external power supply voltage Vcc is applied to word line WL1 connected to memory cell MC1.

In this case, leak currents iO flows to bit line BL through the overerased cells in spite of the fact that word lines WL2, WL3, WL4, . . . connected to memory cells MC2, MC3, MC4, . . . bear the potentials of 0 V, respectively. As a result, selected memory cell MC1 which is actually in the written state is externally determined as it is in the erased state in spite of the fact that a current does not flow through memory cell MC1. Therefore, existence of these overerased cells results in a critical defect in the operation of the flash memory.

Then, description will be given on a DINOR-type flash memory in which bit lines are divided into sectors.

Contents of the DINOR-type flash memory in the prior art will now be described below.

The DINOR-type flash memory in the prior art has a memory cell array 2000 which will be described below with reference to FIG. 48. Memory cell array 2000 includes two memory cell array blocks BLK0 and BLK1 as shown in FIG. 48. FIG. 48 representatively shows only four memory cell transistors MC for each of memory cell array blocks BLK0 and BLK1.

Memory cell array block BLK0 includes memory cell transistors MC1a and MC1b each having a drain connected to a sub-bit line SBL1 as well as memory cell transistors MC2a and MC2b each having a drain connected to a sub-bit line SBL2. Further, memory cell array block BLK0 includes a select gate SG1 which opens and closes a connection between main bit line BL1 and sub-bit line SBL1, and a select gate SG2 which opens and closes a connection between main bit line BL2 and a sub-bit line SBL2.

Control gate electrodes of memory cell transistors MC1a and MC2a are connected to word line WL1, and control gate electrodes of memory cell transistors MC1b and MC2b are connected to word line WL2.

Memory cell transistors included in memory cell array block BLK0 are connected to source line SL1.

Likewise, memory cell array block BLK1 includes memory cell transistors MC3a and MC3b each having a drain connected to a sub-bit line SBL3, and memory cell transistors MC4a and MC4b each having a drain connected to a sub-bit line SBL4.

Memory cell array block BLK1 further includes a select gate SG3 which opens and closes a connection between main bit line BL1 and sub-bit line SBL3 as well as a select gate SG4 which opens and closes a connection between main bit line BL2 and sub-bit line SBL4.

Control gate electrodes of memory cell transistors MC3a and MC4a are connected to word line WL3, and control gate electrodes of memory cell transistors MC3b and MC4b are connected to word line WL4.

Memory cell transistors included in memory cell array block BLK1 are connected to source line SL2.

In the DINOR-type flash memory, write, erase and read operations for the memory cell are performed after selecting the corresponding memory cell array block by opening or closing the corresponding select gate SG. Memory cell MC is formed of a MOS transistor of a floating gate type.

The erase and write operations of the flash memory of the DINOR type will now be described below with reference to FIG. 49.

FIG. 49 shows a distribution of a threshold voltage of the memory cell in the DINOR-type flash memory using external power supply voltage Vcc of 3.3 V.

In the erase operation, electrons are injected into all the floating gate electrodes at a time by the FN tunneling phenomenon on the entire channel surface. Thereby, threshold voltage Vth changes from the lower threshold voltage side to the higher threshold voltage side.

In the write operation, electrons are extracted by the FN tunneling phenomenon at the drain edge. In the DINOR-type flash memory, therefore, the lower threshold voltage distribution side corresponds to the written state, and the higher threshold voltage distribution side corresponds to the erased state.

In the DINOR-type flash memory, the distribution in the lower threshold voltage side is narrowed by repeating such operations that a voltage in a pulse form is applied to extract electrons for one bit, and verification of the threshold voltage is performed. As a result, the lower limit of the distribution in the lower threshold voltage side goes to 1.5 V or more, and the operation using external power supply voltage of 3.3 V can be achieved.

There is a tendency to demand nonvolatile semiconductor memory devices, which can operate with a low voltage and/or low power consumption, and/or can perform fast reading.

A DINOR-type flash memory during a low-voltage operation suffers from a problem which will be described below with reference to FIG. 50.

As shown in FIG. 50, when external power supply voltage Vcc is of a value of 3.3 V or less (e.g., 1.8 V) which is now widely used, the lower limit of the threshold voltage at the lower side of the memory cell in the DINOR-type flash memory goes to 1.5 V or less so that an overwritten cell appears. As a result, it is probably difficult to achieve the read operation using external power supply voltage Vcc as it is, even if the above technology of the DINOR-type flash memory is utilized.

In order to overcome the above problem, such a manner can be envisaged that lowered external power supply voltage Vcc is boosted to a voltage level of or near the currently used value (3.3 V) during the read operation, and the boosted voltage is applied to the word line.

If this manner is employed, however, the reading operation requires a long time due to a time for boosting. Also, the boosting increases a power consumption. Further, circuits operating with 3.3 V increase in number, and this reduces an effect of lower power consumption which can be achieved by lowering the voltage to 1.8 V.

Accordingly, an object of the invention is to provide a nonvolatile semiconductor memory device which can avoid a malfunction due to overerasing or overwriting even in a low-voltage operation.

Another object of the invention is to provide a nonvolatile semiconductor memory device which can perform a fast read operation even with a low-voltage power supply.

Yet another object of the invention is to provide a nonvolatile semiconductor memory device which can operate with a low voltage and can be manufactured at a low cost.

SUMMARY OF THE INVENTION

According to the invention, a nonvolatile semiconductor memory device formed on a semiconductor substrate includes a plurality of memory cells arranged in a plurality of rows and a plurality of columns, a plurality of word lines arranged correspondingly to the plurality of rows, respectively, a plurality of bit lines arranged correspondingly to the plurality of columns, respectively, and a source line supplying a first potential. Each of the plurality of memory cells includes a memory cell transistor and a MOS transistor. Each memory cell transistor includes a control gate carrying a potential controlled by the corresponding word line, a source and a drain to be connected and disconnected together under the control by the potential on the control gate, and a floating gate. Each MOS transistor selectively opens and closes a conduction path of a current flowing between the bit line and the source line through the corresponding memory cell transistor. The plurality of MOS transistors belonging to the same row commonly use a gate layer. The nonvolatile semiconductor memory device further includes a plurality of metal interconnections corresponding to the same row. Each of the plurality of metal interconnections is arranged above the corresponding gate layer with an insulating film having a plurality of connection holes therebetween, and each metal interconnection is connected to the corresponding gate layer through the corresponding connection hole. The nonvolatile semiconductor memory device further includes a switch select circuit selectively supplying a potential to each metal interconnection in response to an external address signal.

Accordingly, the invention has the following advantages. Since the memory cell is formed of the memory cell transistor allowing electrical writing and erasing as well as the MOS transistor controlling the current flowing between the bit line and the source line through the memory cell transistor, it is possible to avoid a leak current flowing from the unselected memory cell which is connected to the same word line as the selected memory cell. Therefore, a malfunction due to overerasing or overwriting can be avoided, and a low-voltage operation is allowed. Further, on/off of the MOS transistor are controlled with the pile-driven metal interconnection so that a fast operation is allowed.

According to another aspect of the invention, a nonvolatile semiconductor memory device formed on a semiconductor substrate includes a plurality of memory cells arranged in a plurality of rows and a plurality of columns, a plurality of word lines arranged correspondingly to the plurality of rows, respectively, a plurality of bit lines arranged correspondingly to the plurality of columns, respectively, and a source line supplying a first potential. The plurality of memory cells are divided into a plurality of sectors each including the plurality of memory cells arranged in a plurality of rows and a plurality of columns. The plurality of bit lines include a plurality of main bit lines extending through the plurality of sectors and arranged correspondingly to the plurality of columns of the memory cells, respectively, and a plurality of sub-bit line groups arranged correspondingly to the plurality of sectors, respectively. Each of the sub-bit line groups has a plurality of sub-bit lines corresponding to the plurality of columns in the corresponding sector, respectively. Each of the plurality of memory cells includes a memory cell transistor and a switch circuit. Each memory cell transistor includes a control gate carrying a potential controlled by the corresponding word line, a source and a drain to be connected and disconnected together under the control by the potential on the control gate, and a floating gate. Each of the switch circuits selectively opens and closes a conductive path of a current flowing between the bit line and the source line through the corresponding memory cell transistor. The nonvolatile semiconductor memory device further includes a row select circuit for selecting the word line in response to an external address signal, a column select circuit for selecting the bit line in response to the external address signal, a switch select circuit for controlling the plurality of switch circuits in response to the external address signal, a write and erase circuit for injecting or extracting electrons into or from the floating gate of the memory cell transistor, and a connection circuit for selectively connecting the plurality of sub-bit line groups to the plurality of main bit lines, respectively.

Accordingly, the invention can further achieve the following advantages. Since the memory cell is formed of the electrically writable and erasable memory cell transistor, and the switch circuit controlling a current flowing between the bit line and the source line through the memory cell transistor, an operation with a low voltage is allowed. Further, owing to division of the bit lines, it is possible to prevent the write operation of one of the memory cell array blocks from affecting the threshold voltage of the memory cell transistor in the other memory cell block.

According to yet another aspect, the invention provides a memory cell forming a memory cell array of a nonvolatile semiconductor memory device formed on a semiconductor substrate, and including a plurality of word lines arranged correspondingly to a plurality of rows in the memory cell array, respectively, a plurality of bit lines arranged correspondingly to a plurality of columns in the memory cell array, respectively, and a plurality of source lines supplying a first potential. The memory cell includes a memory cell transistor arranged between the corresponding bit line and the source line, being turned on/off depending on the potential on the corresponding word line, and allowing control of its threshold voltage in an electrical and nonvolatile manner, and a select transistor selectively opening and closing a conductive path of a current flowing between the bit line and the source line through the memory cell transistor. The memory cell transistor includes a first impurity region formed on a main surface of the semiconductor substrate, a second impurity region formed on the main surface of the semiconductor substrate and spaced by a predetermined distance from the first impurity region, a first electrode layer formed on a region defined between the first and second impurity regions with a first oxide film therebetween, and a second electrode layer formed on the first electrode layer with a first insulating film therebetween. The select transistor includes a third impurity region formed on the main surface of the semiconductor substrate, a fourth impurity region formed on the main surface of the semiconductor substrate and spaced by a predetermined distance from the third impurity region, a third electrode layer formed on a region defined between the third and fourth impurity regions with a second oxide film therebetween, and a fourth electrode layer formed on the third electrode layer with a second insulating film therebetween. Said second and third impurity regions commonly use the same region. The first and second oxide films are formed in the same step, the first and third electrode layers are formed in the same step, the first and second insulating films are formed in the same step, and the second and fourth electrode layers are formed in the same step.

Accordingly, the invention further achieves the following advantages. Since the memory cell is formed of the electrically writable and erasable memory cell transistor and the select transistor controlling the current flowing between the bit line and the source line through the memory cell transistor, an operation with a low voltage is allowed. By forming the memory cell transistor and the select transistor in the same step, these transistors can be formed with the minimum design rule interval.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 22 shows conditions for calculating a bit line capacity CB0 in the NOR-type memory cell array of the embodiment 1;

FIG. 24 shows conditions for calculating a bit line capacity CB1 in the DINOR-type memory cell array of the embodiment 3;

FIG. 25 shows, by way of example, voltage conditions of various voltages applied to the two-transistor type memory cell employing a drain select type connection in nonvolatile semiconductor memory device 200;

FIG. 26 shows, by way of example, voltage conditions of various voltages applied to the two-transistor type memory cell employing a source select type connection in nonvolatile semiconductor memory device 200;

FIG. 35 shows, by way of example, conditions and a writing speed in a write operation of a conventional one-transistor type memory cell using an N-channel MOS transistor as a memory cell;

FIG. 36 shows, by way of example, conditions for writing at the same speed as FIG. 35 in a conventional one-transistor type memory cell using a P-channel MOS transistor as a memory cell;

FIG. 40 shows voltage conditions of various voltages applied to the two-transistor type memory cell employing the connection of a source select type in the embodiment 8;

FIG. 41 shows, by way of example, voltage application conditions of a two-transistor type memory cell of an embodiment 9;

DESCRIPTION OF THE PREFERRED EMBODIMENTS

The invention will be described below with reference to the drawings. The same components bear the same reference numbers or characters, and description of them will not be repeated.

Embodiment 1

A structure of a nonvolatile semiconductor memory device 100 of an embodiment 1 of the invention will now be described below with reference to FIG. 1.

Figure 1:
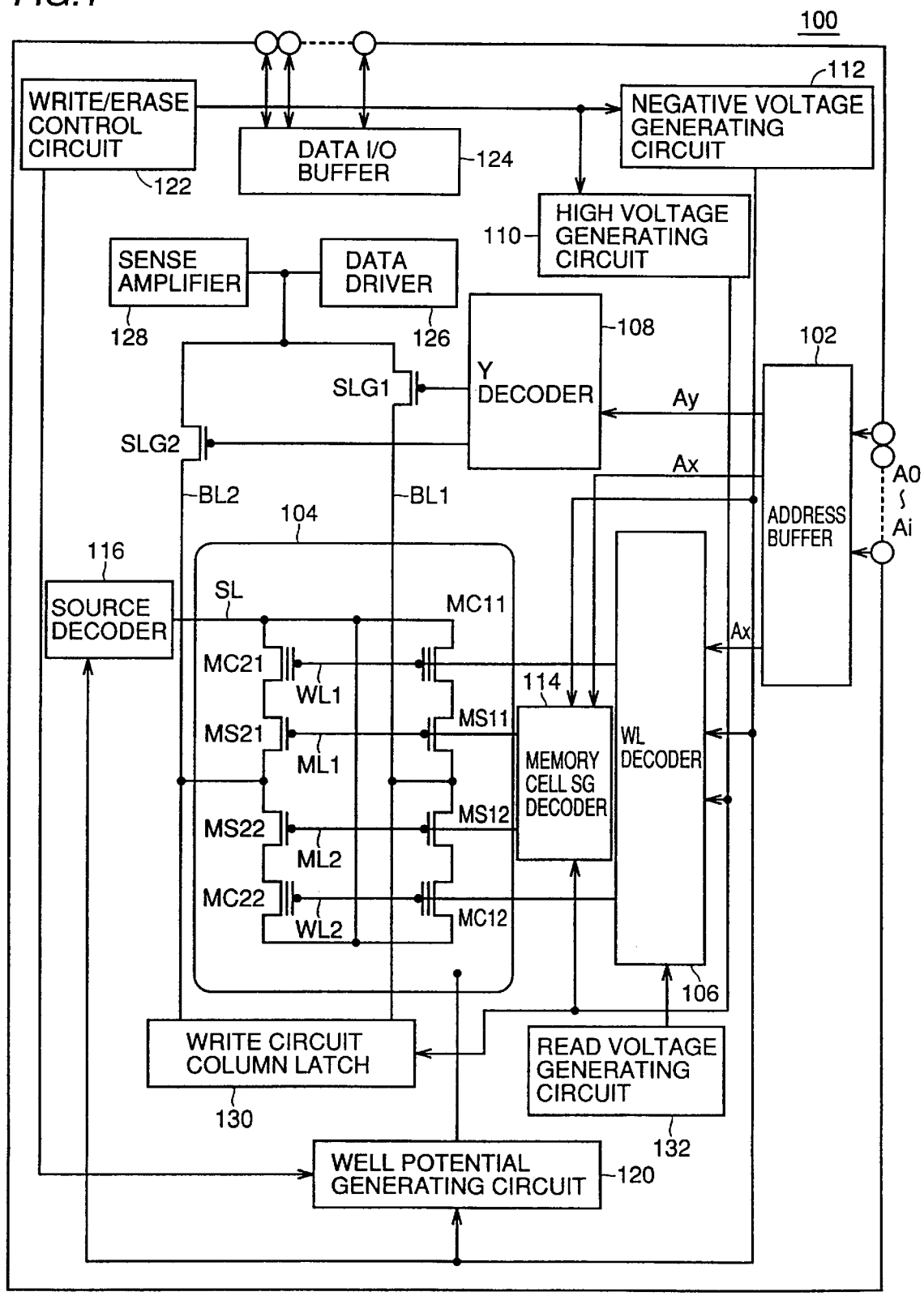
FIG. 1 is a schematic block diagram showing a structure of a nonvolatile semiconductor memory device 100 of an embodiment 1 of the invention.

As shown in FIG. 1, nonvolatile semiconductor memory device 100 includes an address buffer 102, a memory cell array 104, a WL decoder 106, a Y decoder 108, a memory cell SG decoder 114 and a source decoder 116.

Address buffer 102 receives externally supplied address signals A0–Ai, and issues a corresponding internal row address signal Ax and a corresponding internal column address signal Ay. WL decoder 106 receives an internal row address signal Ax from address buffer 102, and selects a corresponding word line in memory cell array 104. Y decoder 108 receives an internal column address signal Ay from address buffer 102, and selects a corresponding bit line in memory cell array 104.

Memory cell array 104 is of a NOR type, and includes a plurality of memory cell transistors MC and a plurality of cell select transistors MS. Memory cell transistor MC is formed of a transistor of a floating gate type. Cell select transistors MS are provided correspondingly to memory cell transistors MC, respectively. Cell select transistor MS is formed of a MOS transistor.

Thus, each memory cell in the embodiment 1 is formed of memory cell transistor MC and cell select transistor MS provided correspondingly to memory cell transistor MC. In the following description, the conventional memory cell formed of one memory cell transistor is called a one-transistor type memory cell, and the memory cell of the embodiment 1 is called a two-transistor type memory cell. Also, in the following description, it is assumed that the memory cell transistors and the cell select transistors are N-channel MOS transistors.

FIG. 1 representatively shows memory cell transistors MC11, MC12, MC21 and MC22 as well as cell select transistors MS11, MS12, MS21 and MS22.

Gate electrodes of memory cell transistors MC11 and MC21 are both connected to word line WL1. Gate electrodes of memory cell transistors MC12 and MC22 are both connected to word line WL2.

Each of source regions of memory cell transistors MC11, MC12, MC21 and MC22 is connected to source line SL.

Cell select transistor MS11 is connected between bit line BL1 and a drain region of memory cell transistor MC11. Cell select transistor MS12 is connected between bit line BL1 and a drain region of memory cell transistor MC12. Cell select transistor MS21 is connected between bit line BL2 and a drain region of memory cell transistor MC21. Cell select transistor MS22 is connected between bit line BL2 and a drain region of memory cell transistor MC22. In the following description, a connection in such a structure that cell select transistor MS is arranged between the drain region of memory cell transistor MC and bit line BL is called a drain select type connection.

Gate electrodes of cell select transistors MS11 and MS21 are both connected to a cell select line ML1. Gate electrodes of cell select transistors MS12 and MS22 are both connected to a cell select line ML2.

WL decoder 106 operates in accordance with internal row address signal Ax sent from address buffer 102, and thereby selects the corresponding word line.

Memory cell SG decoder 114 operates in accordance with internal row address signal Ax sent from address buffer 102 in the write, erase and read operations, and thereby selects one of the cell select lines ML1 and ML2 corresponding to the selected row.

Source decoder 116 adjusts the potential on source line SL in accordance with the write, erase and read operations.

Nonvolatile semiconductor memory device 100 further includes a high voltage generating circuit 110, a negative voltage generating circuit 112, a well potential generating circuit 120 and a read voltage generating circuit 132.

High voltage generating circuit 110 receives external power supply voltage Vcc, and generates a high voltage required for data writing or erasing of the memory cell. Negative voltage generating circuit 112 receives external power supply voltage Vcc, and generates a negative voltage required for write and erase operations of the memory cell array. Read voltage generating circuit 132 generates an arbitrary read voltage.

Well potential generating circuit 120 receives an output of negative voltage generating circuit 112, and controls a well potential on a semiconductor substrate surface at which the memory cell transistor is formed. Write circuit 130 receives the high voltage from high voltage generating circuit 110 and supplies the same to the corresponding bit line.

WL decoder 106 receives the outputs of high voltage generating circuit 110 and negative voltage generating circuit 112. WL decoder 106 supplies a negative voltage to the selected word line in the write operation, and supplies a high voltage to the selected word line in the erase operation. Further, WL decoder 106 receives an arbitrary read voltage generated by read voltage generating circuit 132.

Source decoder 116 receives the output of negative voltage generating circuit 112, sets the source voltage of the memory cell transistor to the negative voltage through source line SL.

Further, nonvolatile semiconductor memory device 100 includes a write/erase control circuit 122, a data I/O buffer 124, a data driver 126, a sense amplifier 128 and a write circuit 130.

Write/erase control circuit 122 controls the write and erase operations for the memory cells. Data I/O buffer 124 receives an externally supplied data, and sends the same to internal circuits. Also, data I/O buffer 124 receives data read from the memory cell, and externally supplies the same. Data driver 126 receives write data sent to data I/O buffer 124, and thereby drives the corresponding bit line potential. Sense amplifier 128 operates in accordance with stored information of the selected memory cell in the data read operation, and thereby issues corresponding read data. Write circuit 130 holds write data sent from data driver 126, and supplies a high voltage generated by high voltage generating circuit 110 to the corresponding bit line.

Data driver 126 and sense amplifier 128 are connected to bit line BL1 through column select gate SLG1, and are connected to bit line BL2 through column select gate SLG2. Gate potentials on column select gates SGL1 and SLG2 are controlled by Y decoder 108. Therefore, the selected bit line is connected to sense amplifier 128 or data driver 126 in accordance with internal column address signal Ay sent from address buffer 102.

An operation of nonvolatile semiconductor memory device 100 of the embodiment 1 will be briefly described below.

Program Operation

For writing data into the memory cell, address signals A0–Ai designating the address of the memory cell to be selected is applied to address buffer 102. Also, data I/O buffer 124 is supplied with data to be written. Thereby, data driver 126 drives the potential level on the corresponding bit line. Write circuit 130 receives write data from data driver 126 through bit line BL1.

It is now assumed that the data is to be written into memory cell transistor MC11. First, erasing is effected on the sector containing memory cell transistor MC11. The sector is a group of the memory cells formed at the same well. The following description will be given particularly with respect to memory cell transistor MC11.

Bit line BL1 is floated under the control by write/erase control circuit 122, and the high voltage generating circuit 110 and the negative voltage generating circuit 112 generate high and negative voltages, respectively. Thereby, source decoder 116 sets the source potential of memory cell transistor MC11 to a negative potential (e.g., −8 V) through source line SL. Also, well potential generating circuit 120 sets the well potential of the memory cell transistor to the same negative potential (e.g., −8 V) as the source potential of memory cell transistor MC11.

Memory cell SG decoder 114 supplies a predetermined potential to cell select line ML1 corresponding to the selected row in response to internal row address signal Ax. WL decoder 106 is controlled by write/erase control circuit 122 to supply a high voltage (e.g., of 10 V) generated by high voltage generating circuit 110 onto word line WL1. Thereby, electrons are injected into the floating gate electrode of memory cell transistor MC11 from the substrate side, and the threshold voltage of memory cell transistor MC11 rises.

Write circuit 130 drives the potential level on bit line BL1 under the control by write/erase control circuit 122. Source decoder 116 sets source line SL1 to the floating state. Well potential drive circuit 120 is controlled by write/erase control circuit 122 to set the well potential, e.g., to 0 V.

Memory cell SG decoder 114 supplies a predetermined potential to cell select line ML1 corresponding to the selected row in response to internal row address signal Ax. WL decoder 106 is controlled by write/erase control circuit 122 to supply a potential (e.g., of −10 V) generated by negative voltage generating circuit 112 onto word line WL1. Write circuit 130 is controlled by write/erase control circuit 122 to set a high potential (e.g., 5 V) on bit line BL1 based on the high voltage generated by high voltage generating circuit 110.

As a result, electrons are extracted from the floating gate of memory cell transistor MC11 so that the threshold voltage of memory cell transistor MC11 changes.

In the conventional NOR-type flash memory, even when data is to be written into only one memory cell transistor connected to bit line BL, a high voltage is also applied inevitably to the drains of the unselected memory cell transistors connected to the same bit line. This changes the quantity of charges in the floating gate of the unselected memory cell transistor on the same bit line, and may change the data written therein in the worst case.

In contrast to this, the two-transistor type memory cell of the embodiment 1 can operate in such a manner that only the memory cell transistor selected for writing is connected to the bit line owing to employment of the cell select transistor. Therefore, the write operation of one memory cell transistor does not affect the threshold voltages of the other memory cell transistors.

Read Operation

When data is to be written from the memory cell, address buffer 102 is supplied with address signals A0–Ai designating the address of the memory cell to be selected, and issues internal row address signal Ax.

It is now assumed that memory cell transistor MC1 is to be selected. Memory cell SG decoder 114 supplies a predetermined potential onto cell select line ML1 corresponding to the row selected for reading in response to internal row address signal Ax. WL decoder 106 supplies a predetermined potential onto word line WL1 selected for reading in response to internal row address signal Ax. Bit lines BL1 and source line SL are also supplied with a predetermined voltage. Sense amplifier 128 senses a change in potential on bit line BL1 through column select gate SLG1.

The structure of the memory cell array of the embodiment 1 will be described below more in detail with reference to FIG. 2.

Figure 2:
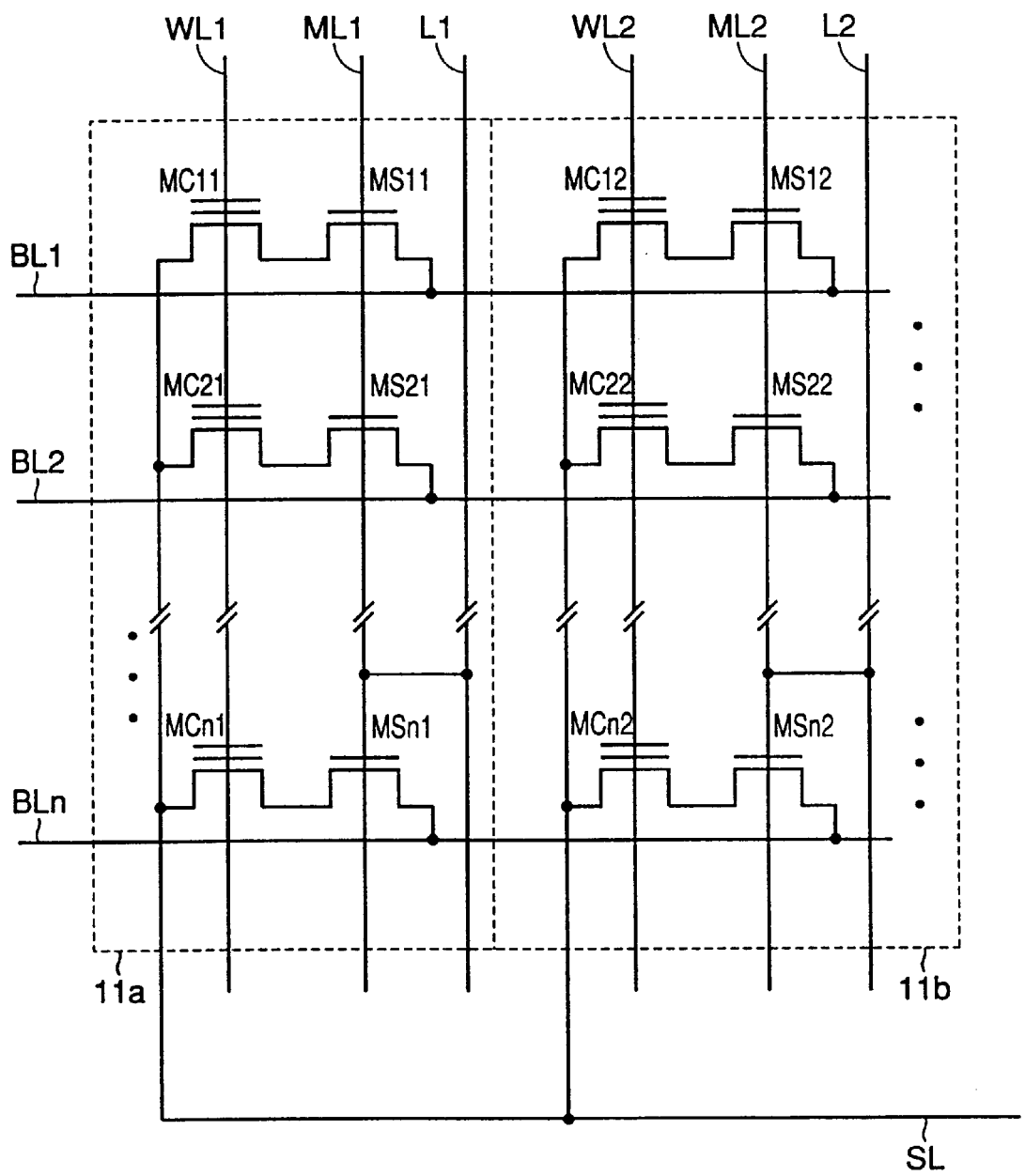
FIG. 2 is a circuit diagram showing, on an enlarged scale, a structure of a memory cell array 104 in nonvolatile semiconductor memory device in FIG. 1.

In FIG. 2, memory cell array 104 has divided wells 11a and 11b, each of which is supplied with a potential from well potential generating circuit 120 shown in FIG. 1.

For the two-transistor type memory cell of the embodiment 1, a plurality of signal lines L are employed for controlling on/off of cell select transistor MS as shown in FIG. 2. FIG. 2 representatively shows only signal lines L1 and L2. Signal lines L are made of a material of a low resistance such as aluminum. Signal line L1 supplies to cell select line ML1 the potential sent from memory cell SG decoder 114.

Cell select line ML is formed by mutually connecting the gate electrodes of the cell select transistors on the same row in the same selector. More specifically, in a step of etching the gate electrode layers of the cell select transistors, the gate electrodes in the same sector are processed as an integral patter so that the above structure is formed.

Signal line L2 likewise supplies to cell select line ML2 the potential sent from memory cell SG decoder 114 shown in FIG. 1.

Signal line L has portions which are located at intervals of n bits (n>0), and are pile-driven to the electrode layer forming the gate electrodes of cell select transistors MS.

A structure including the memory cell and signal line L will now be described below with reference to FIGS. 3 and 4.

Figure 3:
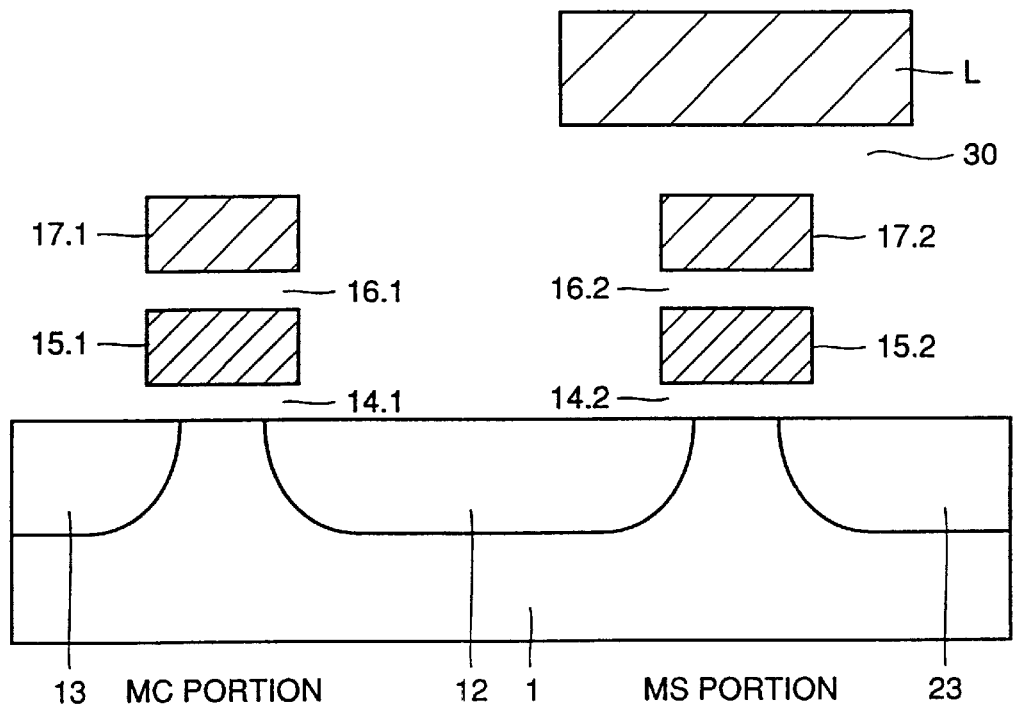
FIG. 3 is a cross section of a region not containing a pile-driven portion of a signal line L in the memory cell array shown in FIG. 2.
Figure 4:
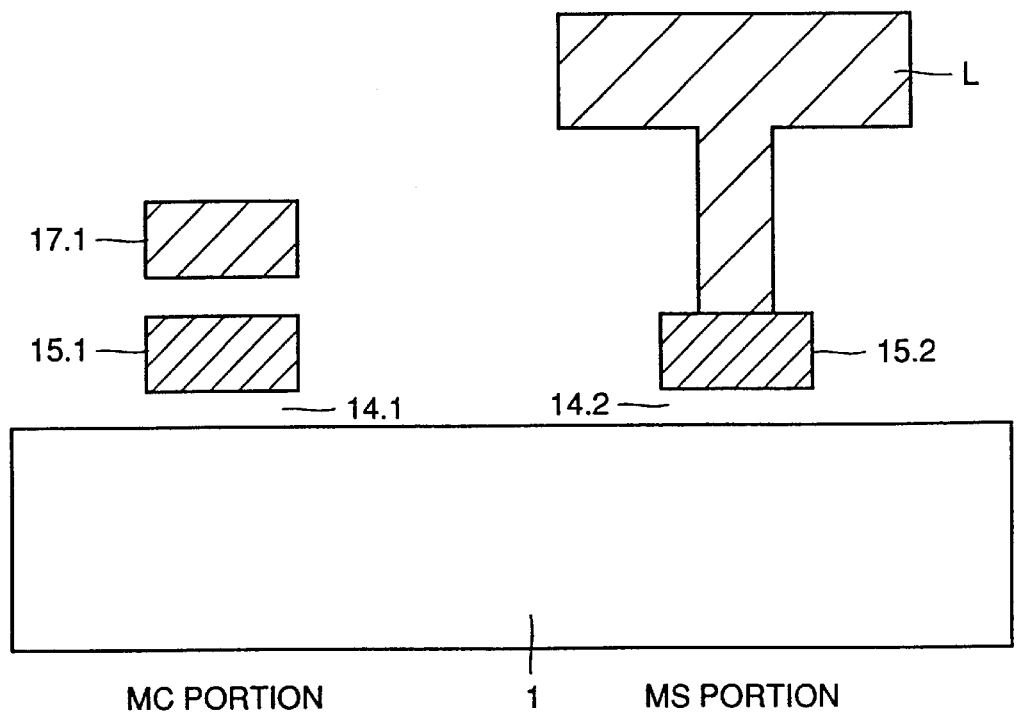
FIG. 4 is a cross section of a region not containing the pile-driven portion of signal line L in the memory cell array shown in FIG. 2.

FIG. 3 is a cross section of a region not including a pile-driven portion of signal line L in the memory cell array shown in FIG. 2, and FIG. 4 is a cross section of a region containing the pile-driven portion of signal line L in the memory cell array shown in FIG. 2.

Memory cell transistor MC includes an n-type source region 12 and an n-type drain region 13 formed at the main surface of p-type semiconductor substrate 1 as well as a floating gate electrode 15.1 formed on a channel region defined between source and drain regions 12 and 13 with a tunnel oxide film 14.1 therebetween, and a control gate electrode 17.1 formed on a floating gate electrode 15.1 with an interlayer insulating film 16.1 therebetween.

Cell select transistor MS includes n-type source region 12 and an n-type drain region 23 formed at the main surface of p-type semiconductor substrate 1 as well as a floating gate electrode 15.2 formed on a channel region defined between source and drain regions 12 and 23 with an oxide film 14.2 therebetween, and a control gate electrode 17.2 formed on a floating gate electrode 15.2 with an interlayer insulating film 16.2 therebetween.

As shown in FIG. 3, memory cell transistor MC and cell select transistor MS commonly use source region 12 formed at the main surface of p-type semiconductor substrate 1. Oxide films 14.1 and 14.2 which form memory cell transistors MC and cell select transistor MS, respectively, are formed in the same manufacturing step. Floating gate electrodes 15.1 and 15.2 which form memory cell transistors MC and cell select transistor MS, respectively, are formed in the same manufacturing step. Interlayer insulating films 16.1 and 16.2 of memory cell transistors MC and cell select transistor MS are formed in the same manufacturing step. Control gate electrodes 17.1 and 17.2 of memory cell transistors MC and cell select transistor MS are formed in the same manufacturing step.

Signal line L is arranged on the gate electrode of cell select transistor MS with an insulating film 30 therebetween.

As shown in FIG. 4, signal line L is connected to the electrode layer, which forms the control gate electrode of cell select transistor MS, through a contact hole.

The contact hole is formed at a region where the memory cell transistor and cell select transistor are not formed.

A method of manufacturing the two-transistor type memory cell of the embodiment 1 will now be described below with reference to FIGS. 5 to 14.

Figure 5:
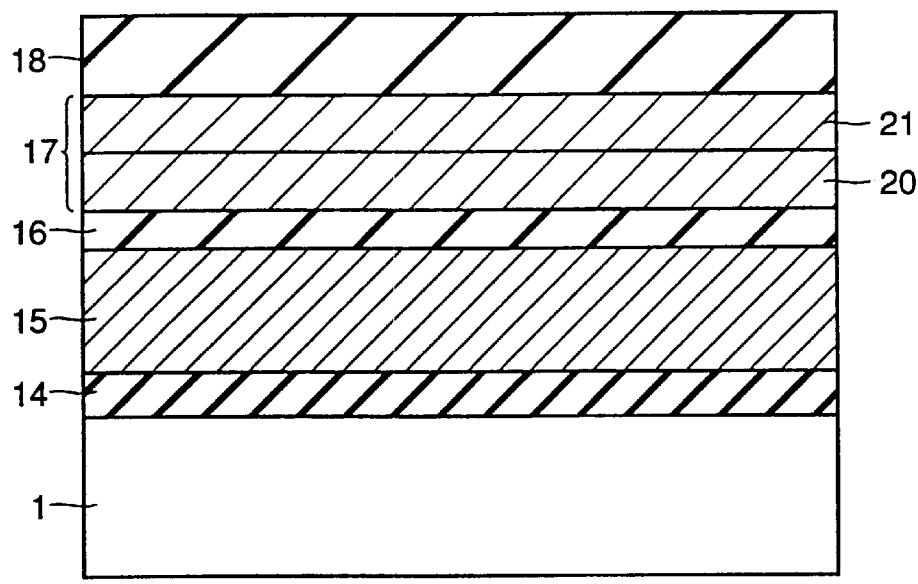
FIGS. 5 to 14 are cross sections showing steps in a method of manufacturing the memory cell of a two-transistor type, respectively.

As shown in FIG. 5, thermal oxidation is effected on p-type silicon substrate 1 to form a tunnel oxide film 14 on the whole surface of p-type silicon substrate 1. A first polycrystalline silicon film 15 (for the floating gate electrode) of about 1200 Å in thickness is formed on tunnel oxide film 14 by the CVD method or the like.

A high-temperature oxide film of about 100 Å in thickness is formed on first polycrystalline silicon film 15 by the CVD method or the like. A silicon nitride film of about 100 Å in thickness is formed on the high-temperature oxide film by the CVD method or the like. A high-temperature oxide film of about 150 Å in thickness is formed on the silicon nitride film by the CVD method or the like. Thereby, a layered film 16 which is formed of the silicon oxide film, silicon nitride film and silicon oxide film, and will be referred to as an "ONO film" hereinafter, is formed.

On ONO film 16, a second polycrystalline silicon film 20 having a thickness of about 1200 Å and doped with impurity is then formed by the CVD method. A tungsten silicide (WSi) layer 21 of about 1200 Å in thickness is formed on second polycrystalline silicon film 20 by a sputtering method. These films form a conductive film 17 which will form the control gate electrode. A TEOS (Tetra Ethyl Ortho Silicate) film 18 is deposited on conductive layer 17.

A method of manufacturing the memory cell array corresponding to the section shown in FIG. 3 will be described below with reference to cross sections of FIGS. 6 to 9.

Figure 6:
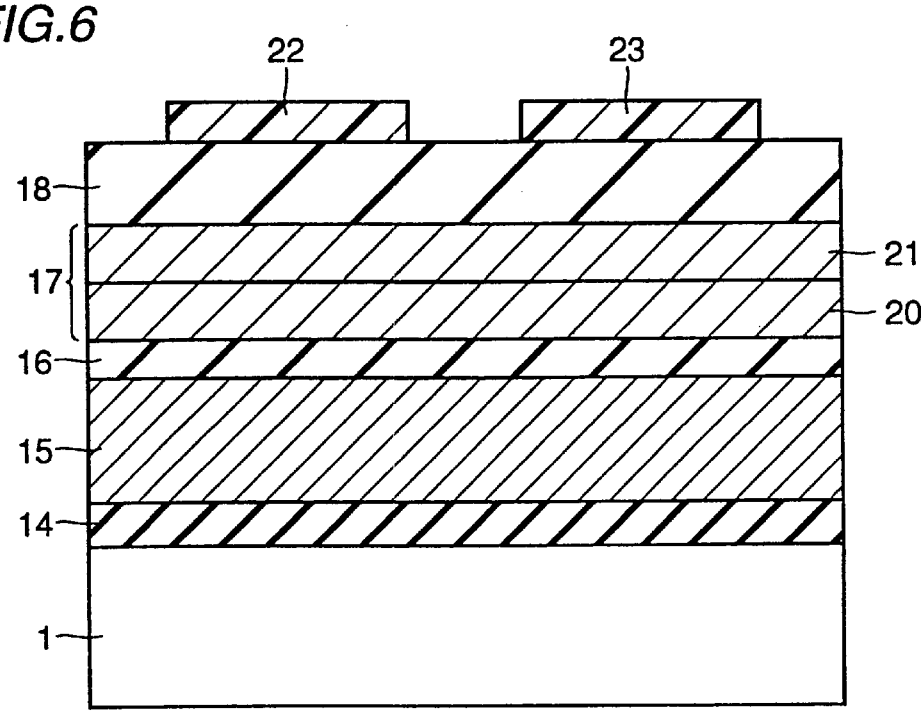

As shown in FIG. 6, resist masks 22 and 23 are formed on portions of TEOS oxide film 18 corresponding to memory cell transistor MC and cell select transistor MS, respectively. TEOS oxide film 18 is etched.

Figure 7:
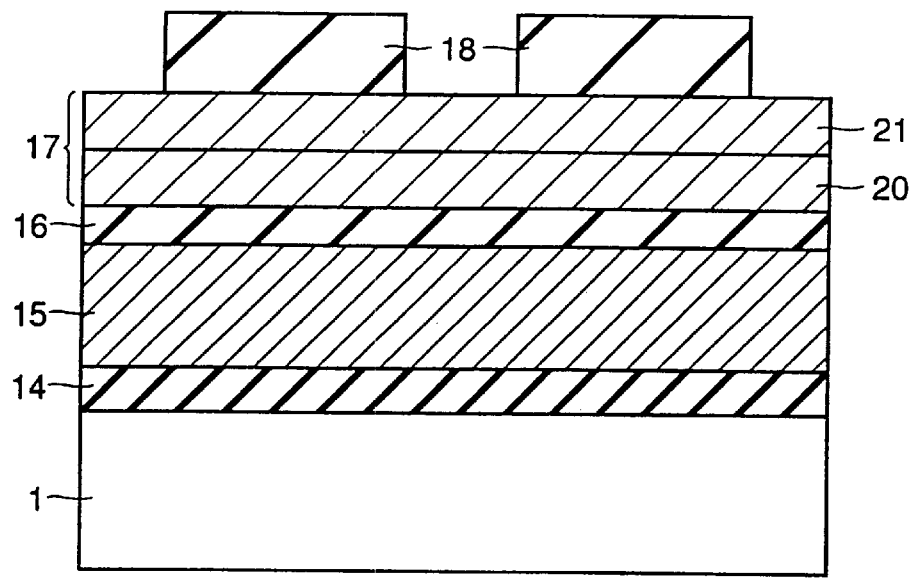
Figure 8:
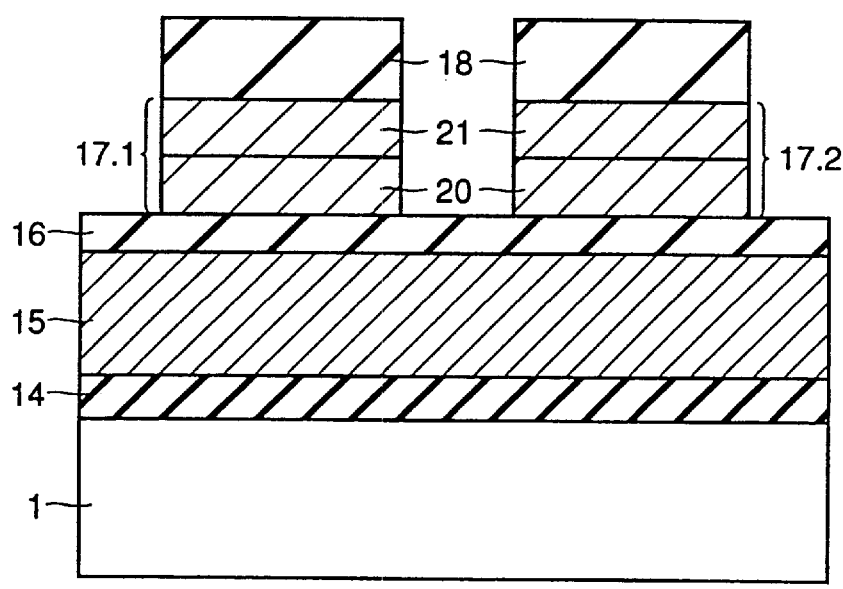
Figure 9:
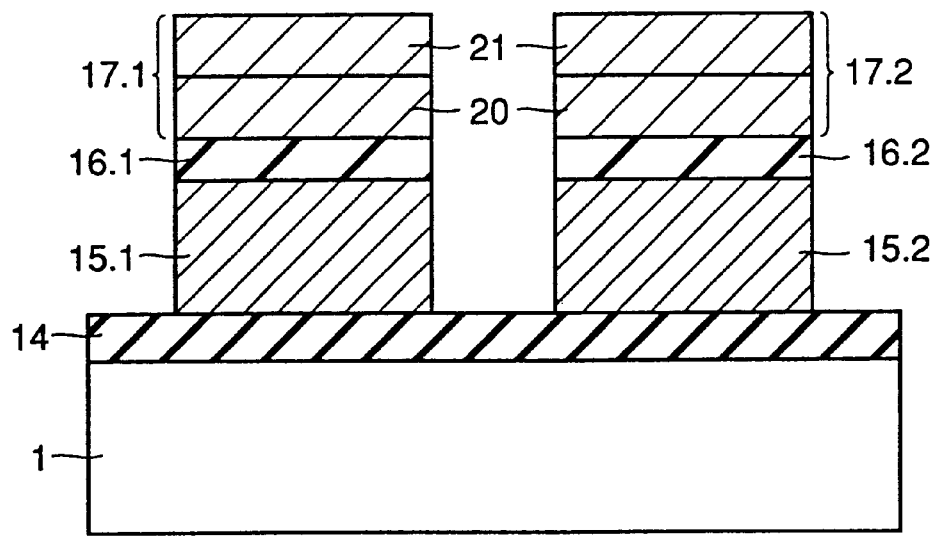

As shown in FIG. 7, tungsten silicide (WSi) layer 21 and second polycrystalline silicon film 20 are etched using etched TEOS oxide film 18 as a resist. Thereby, conductive layers 17.1 and 17.2 for memory cell transistor MC and cell select transistor MS are formed, respectively, as shown in FIG. 8. At the same time, gates of peripheral transistors are etched. Using TEOS oxide film 18 as a resist, ONO film 16 and first polycrystalline silicon film 15 are etched. Thereby, cell select transistor MS at the portion on which the pile driving will not be effected is formed at the same step as memory cell transistor MC. A method of manufacturing the memory cell array corresponding to the section shown in FIG. 4 will be described below with reference to FIGS. 10 to 14.

Figure 10:
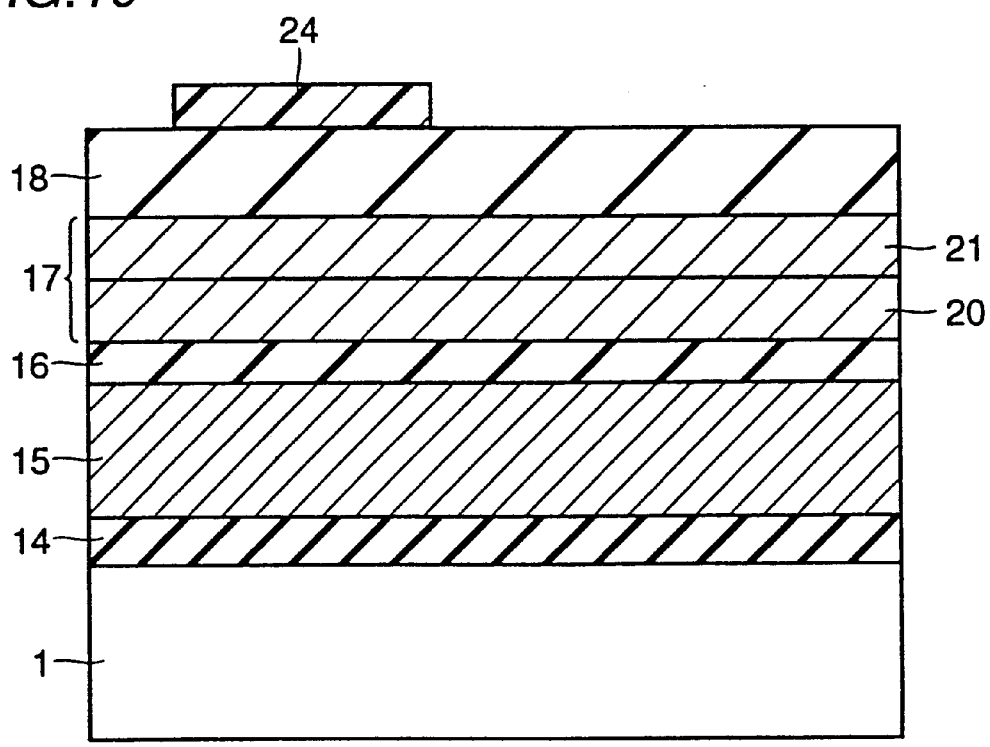

For the portion into which signal line L is to be pile-driven, as shown in FIG. 10, a resist mask 24 is formed on a portion of TEOS oxide film 18 corresponding to memory cell transistor MC. Then, TEOS oxide film 18 is etched.

Figure 11:
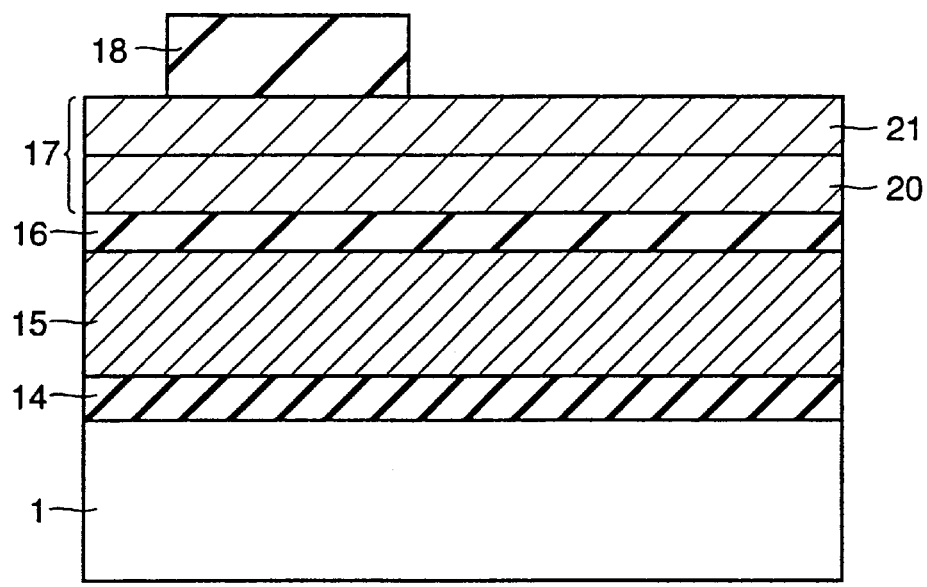
Figure 12:
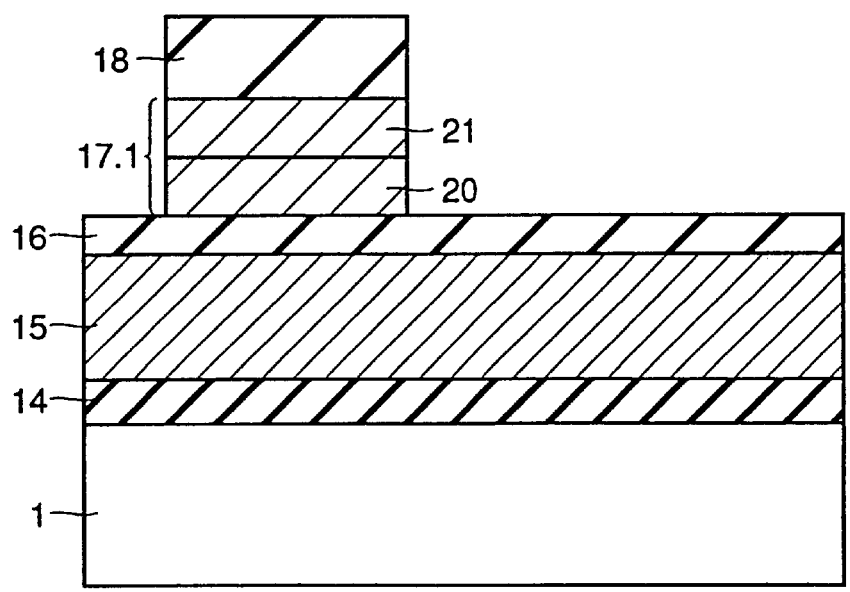

As shown in FIG. 11, tungsten silicide (WSi) layer 21 and second polycrystalline silicon film 20 are etched using etched TEOS oxide film 18 as a resist. Thereby, conductive layer 17.1 for memory cell transistor MC is formed as shown in FIG. 12. At the same time, gates of the peripheral transistor are etched.

Figure 13:
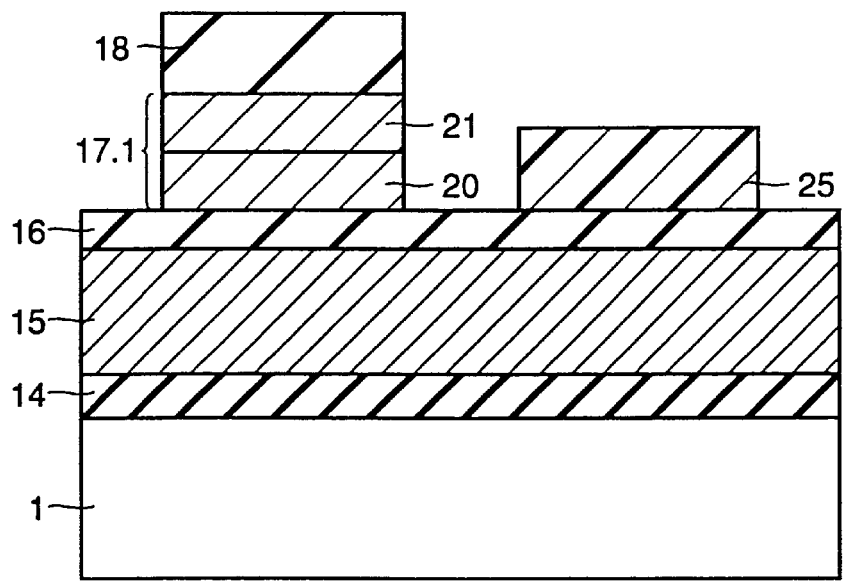
Figure 14:
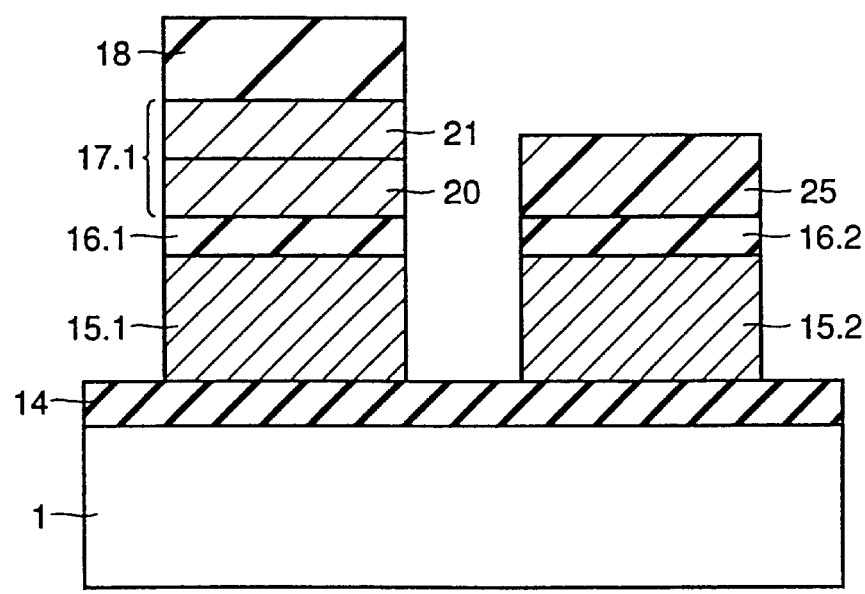

Then, as shown in FIG. 13, a resist mask 25 is formed to cover only the cell select transistor MS portion. Using TEOS oxide film 18 and resist 25 as a mask, etching is effected on ONO film 16 and first polycrystalline silicon film 15. Thereby, cell select transistor provided with the pile-driven portion of signal line L is formed together with memory cell transistor MC as shown in FIG. 14.

The cell select transistor thus formed in each memory cell has the gate oxide film, which is adjacent to the corresponding memory cell transistor, is formed at the same time as the tunnel oxide film of the adjacent memory cell transistor and has the same thickness as this tunnel oxide film. Also, the cell select transistor thus formed is formed of the floating gate electrode layer, the interlayer insulating film and the control gate electrode layer, which are the same as those of the adjacent memory cell transistor.

Oxide film 14 portion shown in FIGS. 10 to 14 may be an element isolating oxide film.

Figure 15:
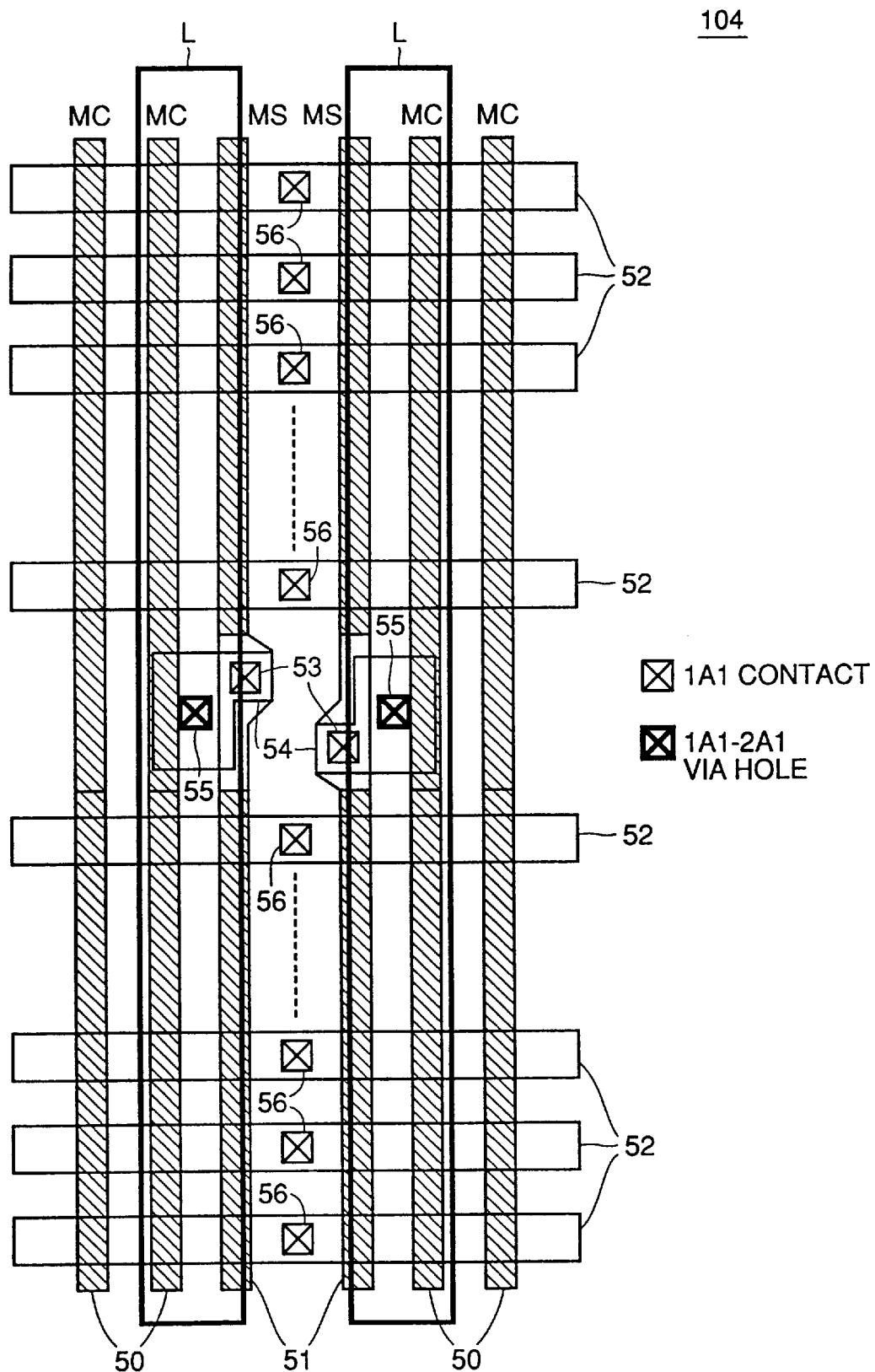
FIG. 15 is a plan showing, by way of example, a layout of memory cell array 104.

An example of the layout of memory cell array 104 will now be described below with reference to FIG. 15, and a layout of one unit of the memory cell in FIG. 15 will be described below with reference to FIG. 16. As shown in FIG. 15, gate electrode patterns 50 corresponding to the gate electrode portions of the memory cell transistors as well as gate electrode patterns 51 corresponding to the gate electrodes of the cell select transistors are arranged in the row direction. Aluminum interconnection patterns 52 which correspond to the bit lines and are formed at the first level are arranged in the column direction. An interlayer insulating film formed on the gates of the cell select transistors is provided with connection holes corresponding to contact hole patterns 53 for connecting the pile-driven portions of the cell select transistors to aluminum interconnections 54 at the first level, respectively. The interlayer insulating film layer formed on the aluminum interconnections 54 at the first level is provided with connection holes corresponding to via hole patterns 55 for connecting first aluminum interconnections 54 to aluminum interconnections at the second level corresponding to signal lines L, respectively. Bit lines BL and the drain regions of the cell select transistors are connected together via contact holes 56, respectively.

Figure 16:
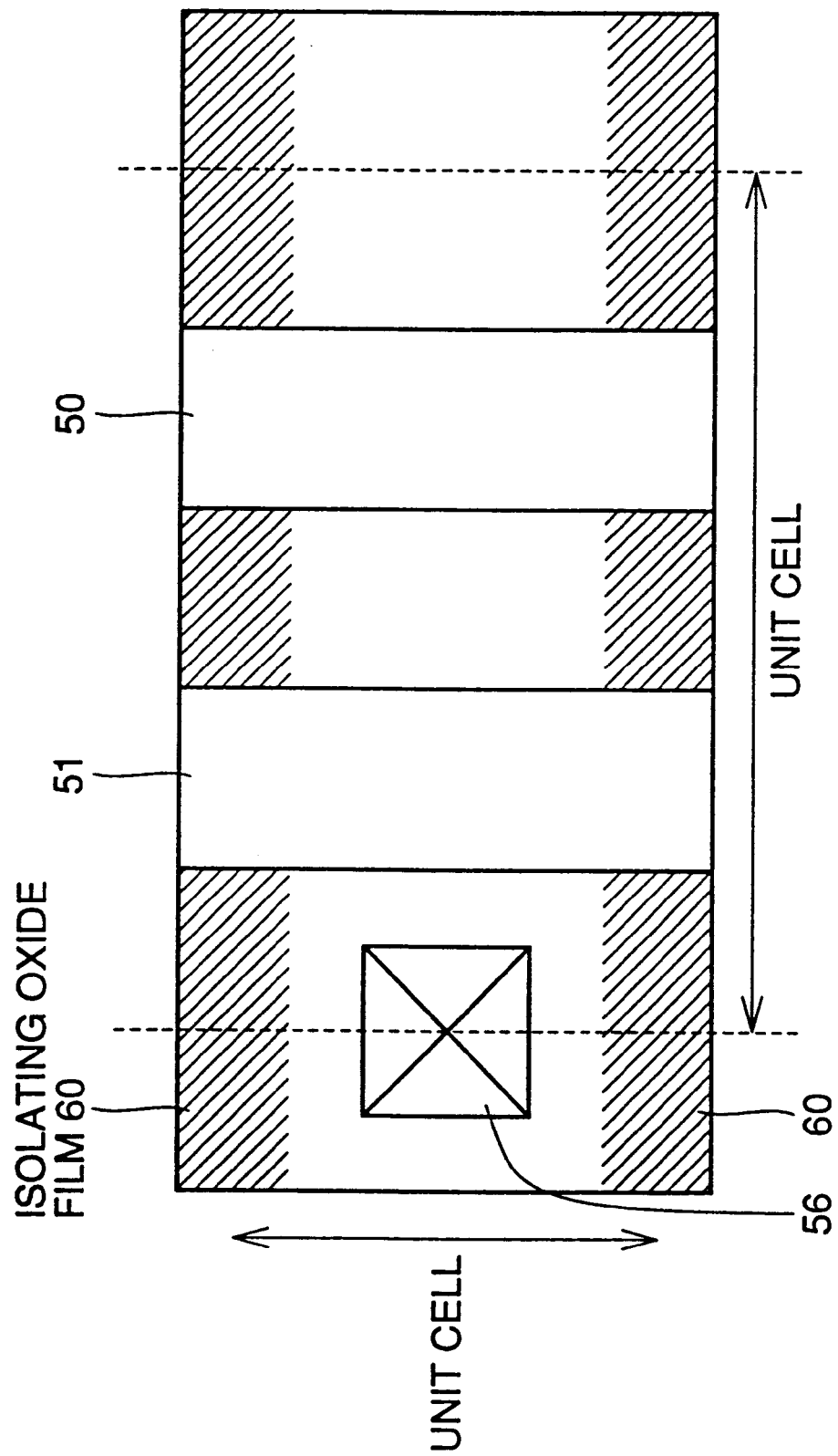
FIG. 16 is a plan showing a layout of one unit of a memory cell in FIG. 15.

As shown in FIG. 16, an active region width of the memory cell transistor and an active region width of the cell select transistor are defined by isolating oxide film 60.

Figure 17:
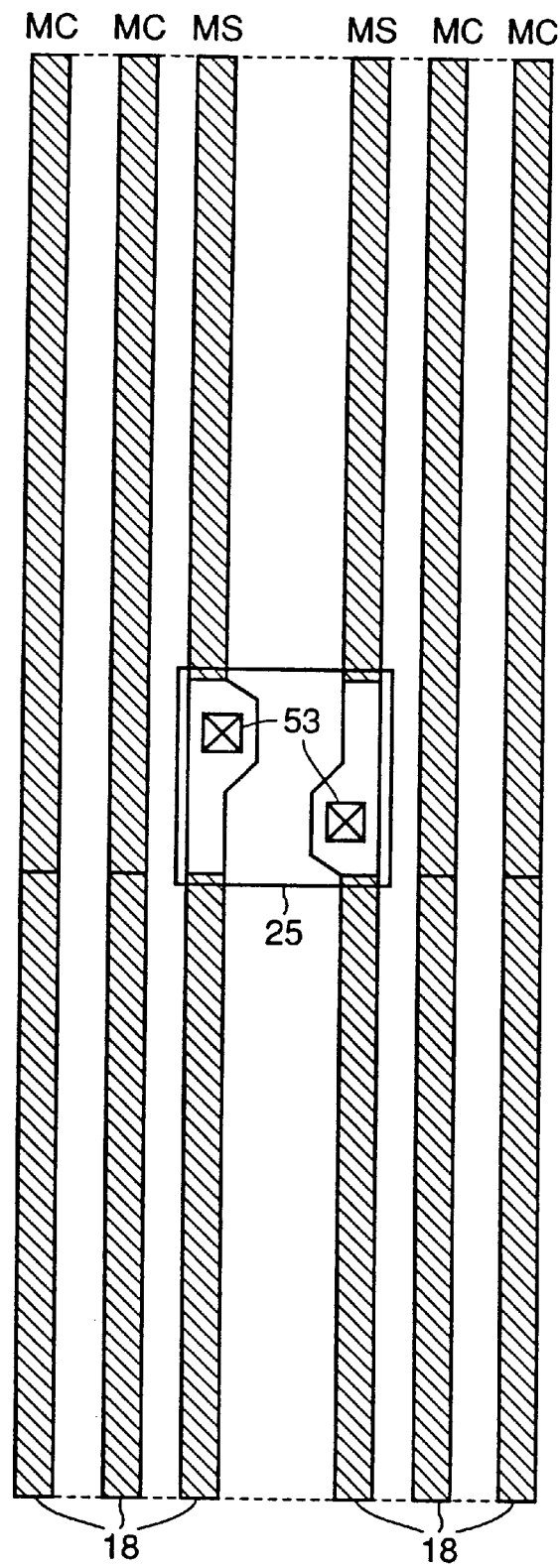
FIG. 17 shows, by way of example, a memory cell gate patterning mask for memory cell array 104 corresponding to FIG. 15.

As example of a memory cell gate patterning mask for memory cell array 104 in FIG. 15 will now be described below with reference to FIG. 17. In FIG. 17, the floating gate electrode layer of the cell select transistor, which was not removed by etching, is left at the region covered by resist 25 shown in FIG. 13.

In the portion not covered with resist 25, ONO films 16.1 and 16.2 as well as floating gate electrode layers 15.1 and 15.2 are etched with a mask formed of TEOS film 18 remaining on the gate electrode layer of the memory cell transistor and the gate electrode layer of the cell select transistor.

Figure 18:
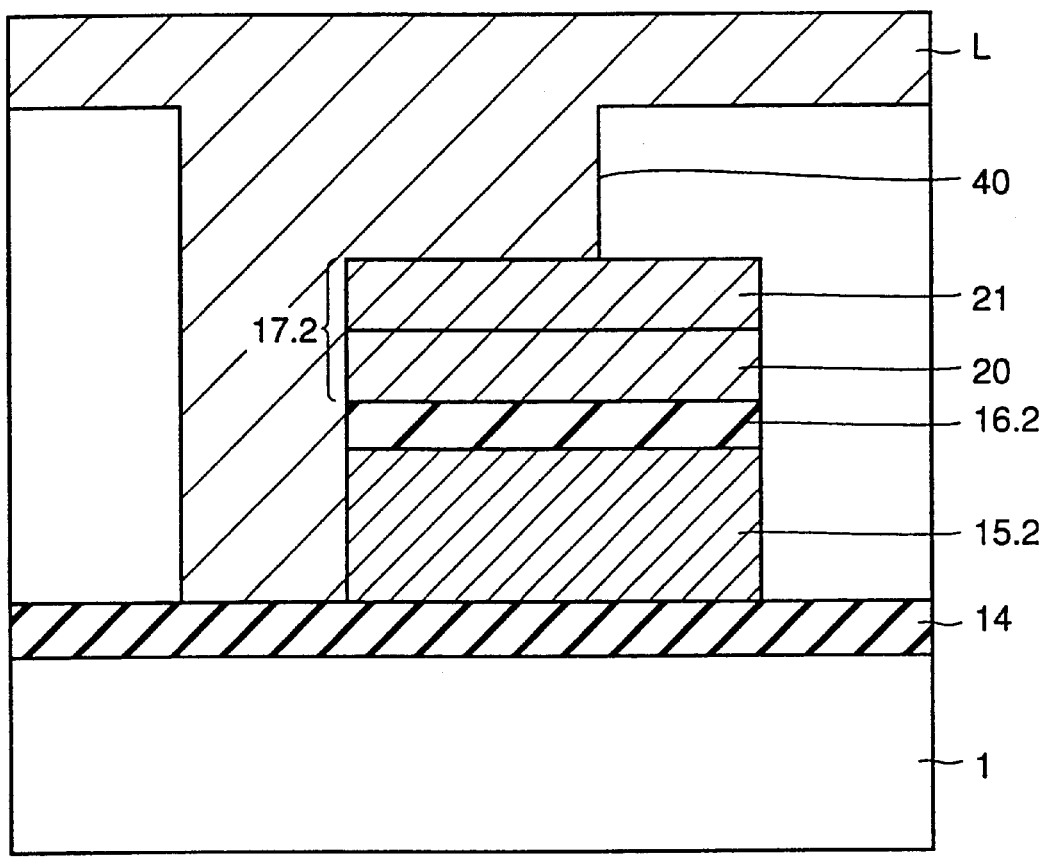
FIG. 18 is a cross section showing a structure for performing pile driving without removing a control gate electrode layer as a result of modification of the memory cell gate patterning mask.

With reference to FIG. 18, description will now be given on a structure in which pile driving is performed without removing the control gate electrode layer owing to change of the memory cell gate patterning mask. As shown in FIG. 18, the side wall of floating gate electrode layer 15.2 and the side wall of control gate electrode layer 17.2 are connected to an AL contact 40. Thereby, signal line L formed of the AL interconnection is connected to floating gate electrode layer 15.2.

The memory cell transistor and the cell select transistor may employ a source select type connection in which memory cell transistor MC is arranged between cell select transistor MS and bit line BL, in stead of the foregoing drain select type connection.

As described above, one memory cell is formed of the memory cell transistor and the cell select transistor. Thereby, it is possible to avoid a leak current from the unselected memory cells connected to the same word line as the selected memory cell during the read operation so that the read operation with a low voltage can be achieved.

Since the cell select transistor is formed in the same step as the memory cell transistor, it can be formed with the minimum design rule interval.

Since the cell select transistor can be rapidly turned on and off using the signal line of aluminum arranged parallel with the control gate electrode of the cell select transistor, a fast read operation can be performed.

Embodiment 2

An operation of a nonvolatile semiconductor memory device of an embodiment 2 according to the invention will be described below.

In the embodiment 2, nonvolatile semiconductor memory device 100 having the two-transistor type memory cells described as the embodiment 1 has such a feature that the voltage which is applied to the control gate electrode of the memory cell transistor in the read operation is at an arbitrary potential, and the voltage at the same level as the read operation is applied to all the memory cell transistors during stand by.

Figures 19, 20:
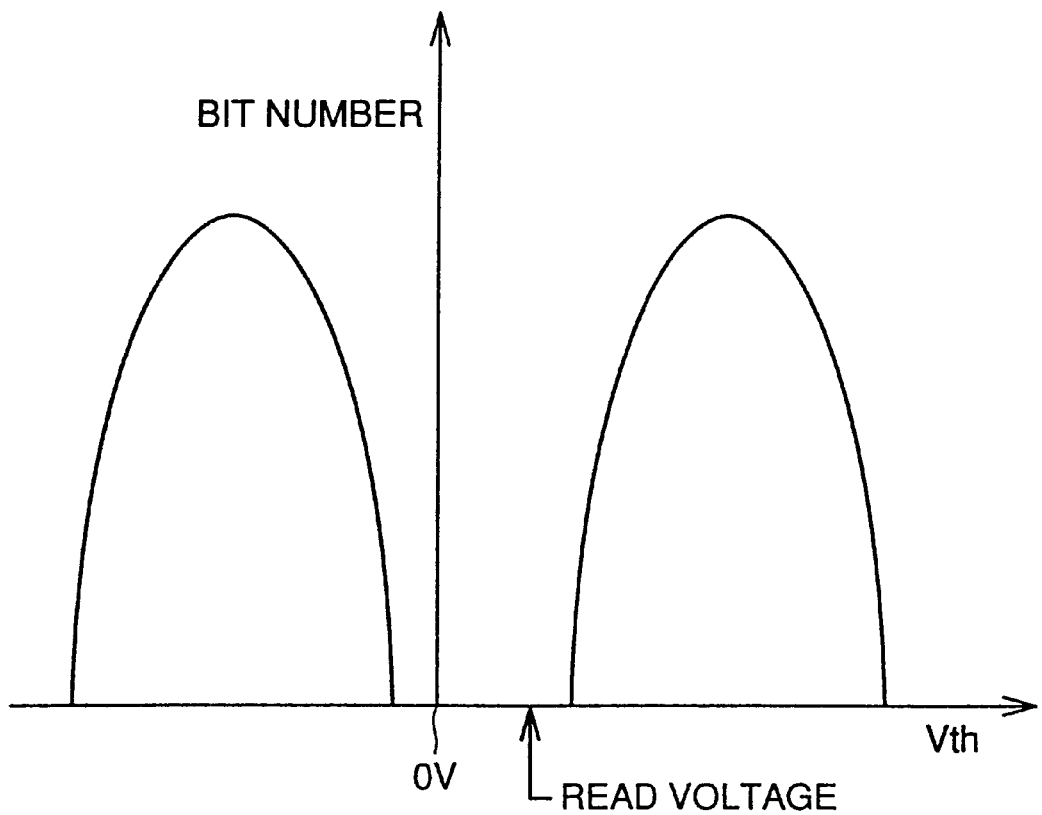
FIG. 19 shows, by way of example, a threshold voltage distribution at a memory cell portion of a memory cell of the two-transistor type of an embodiment 2.
FIG. 20 shows, by way of example, voltage conditions of various voltages applied to the two-transistor type memory cell employing a drain select type connection.

An example of a threshold voltage distribution at the memory cell portion in the two-transistor type memory cell of the embodiment 2 will be described below with reference to FIG. 19. As shown in FIG. 19, the threshold voltage of the memory cell transistor of the embodiment 2 which is distributed in a lower side may be lower than 0 V. In accordance with this, the voltage (read voltage) applied to the control gate electrode of the memory cell transistor may be arbitrarily selected.

The foregoing is allowed for the following reason. In the two-transistor type memory cell, each memory cell transistor is connected to the dedicated cell select transistor. Therefore, all the cell select transistors corresponding to the unselected memory cell transistors which are connected to the same bit line as the selected memory cell can be turned off, whereby it is possible to prevent current leak from the unselected memory cell transistors.

A relationship between the read voltage and the voltage during standby in the memory cell transistor portion of the two-transistor type memory cell of the embodiment 2 will be described below with reference to FIG. 20 showing, as a typical example, various voltages of a two-transistor type memory cell of a drain select type connection. In FIG. 20, Vcg represents a voltage (read voltage) applied to the control gate electrode of the memory cell transistor, and Vs represents a voltage applied to the source region connected to the source line. Vd represents a voltage applied to the drain region connected to the bit line, and Vsg represents a voltage applied to the gate electrode of the cell select transistor.

As shown in FIG. 20, the same voltage as that in the read operation can be applied to the control gate electrode of the memory cell transistor during standby. This is allowed because all the memory cell transistors can be disconnected from the bit line by turning off the cell select transistors corresponding to the memory cell transistors, respectively, and therefore voltage adjustment between the standby state and the read operation is not required.

When an arbitrary voltage other than external power supply voltage Vcc is used as read voltage Vcg, read voltage Vcg is formed by the read voltage generating circuit 132 shown in FIG. 1 and is supplied to WL decoder 106.

Thus, in nonvolatile semiconductor memory device 100 of the embodiment 2, the write or erase speed can be adjusted by setting read voltage Vcg to an arbitrary value.

By using the same voltage as read voltage Vcg during standby, it is required to charge only the gate voltage of the cell select transistor to the predetermined level. Thus, the read operation can be performed without changing read voltage Vcg (i.e., voltage applied to the word line) so that a fast read operation can be achieved without providing a pile-driven portion of the aluminum interconnection connected to the word line.

Embodiment 3

A structure of a nonvolatile semiconductor memory device 200 of an embodiment 3 of the invention will now be described below with reference to FIG. 21.

Figure 21:
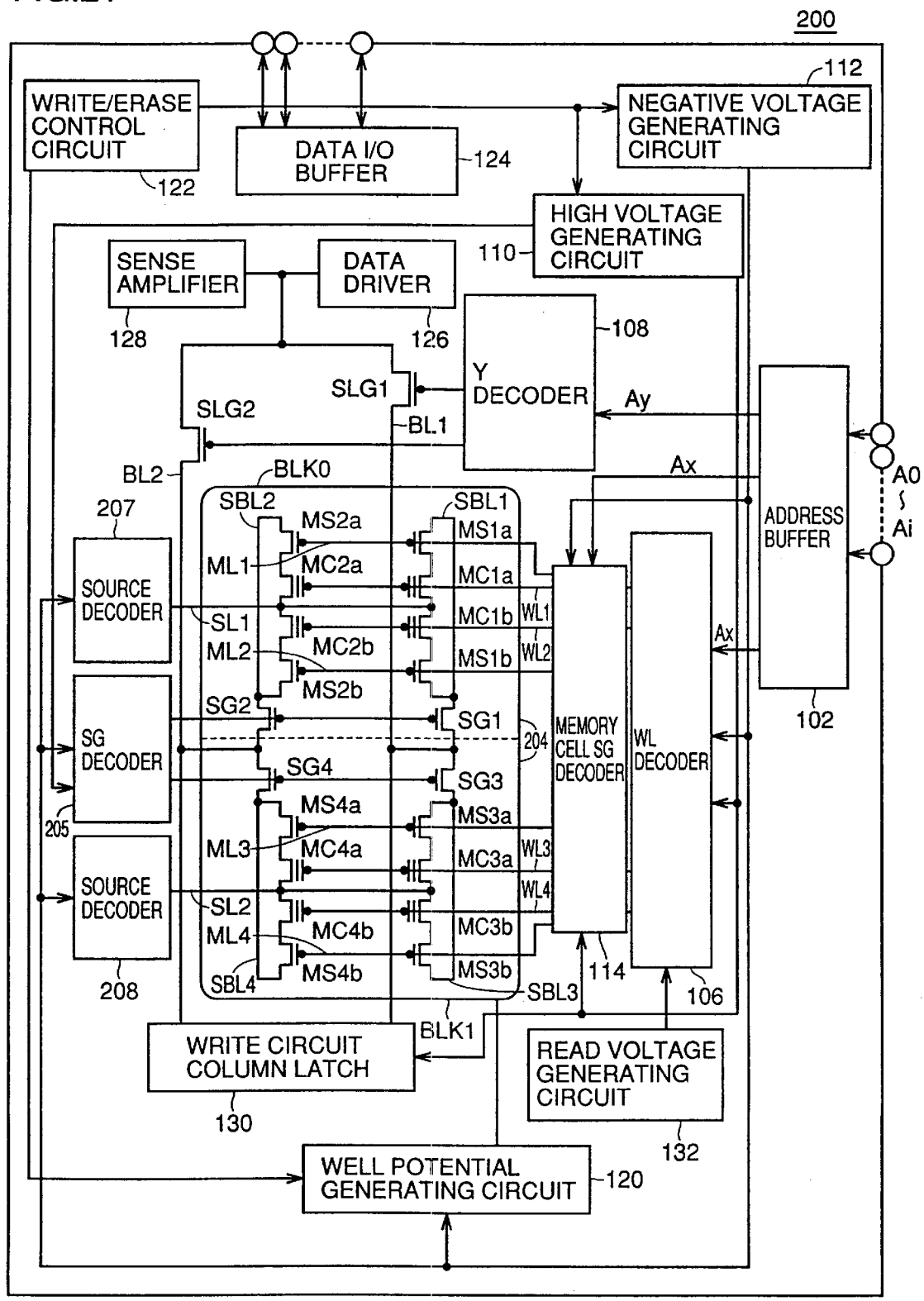
FIG. 21 is a schematic block diagram showing a structure of a nonvolatile semiconductor memory device 200 of an embodiment 3 of the invention.

Referring to FIG. 21, nonvolatile semiconductor memory device 200 includes a memory cell array 204 in place of memory cell array 104 in nonvolatile semiconductor memory device 100 as well as source decoders 207 and 208 in place of source decoder 116, and also includes a SG decoder 205.

Memory cell array 204 is of a DINOR type, and includes a plurality of memory cell array blocks BLK. FIG. 21 representatively shows two memory cell array blocks BLK0 and BLK1, in which four memory cell transistors and four cell select transistors are provided for each memory cell array block BLK.

Memory cell array block BLK0 includes memory cell transistors MC1a, MC1b, MC2a and MC2b as well as cell select transistors MS1a, MS1b, MS2a and MS2b, and also includes select gates SG1 and SG2.

Sources of memory cell transistors MC1a and MC1b are both connected to source line SL1. Sources of memory cell transistors MC2a and MC2b are both connected to source line SL1.

Cell select transistor MS1a is connected between a drain of memory cell transistor MC1a and sub-bit line SBL1. Cell select transistor MS1b is connected between a drain of memory cell transistor MC1b and sub-bit line SBL1.

Cell select transistor MS2a is connected between a drain of memory cell transistor MC2a and sub-bit line SBL2. Cell select transistor MS2b is connected between a drain of memory cell transistor MC2b and sub-bit line SBL2.

Select gate SG1 opens and closes a connection between main bit line BL1 and sub-bit line SBL1. Select gate SG2 opens and closes a connection between main bit line BL2 and sub-bit line SBL2.

Gate electrodes of memory cell transistors MC1a and MC2a are both connected to word line WL1, and gate electrodes of memory cell transistors MC1b and MC2b are both connected to word line WL2.

Memory cell array block BLK1 includes memory cell transistors MC3a, MC3b, MC4a and MC4b as well as cell select transistors MS3a, MS3b, MS4a and MS4b, and also includes select gates SG3 and SG4.

Sources of memory cell transistors MC3a and MC3b are connected to both source line SL2. Sources of memory cell transistors MC4a and MC4b are both connected to source line SL2.

Cell select transistor MS3a is connected between a drain of memory cell transistor MC3a and sub-bit line SBL3. Cell select transistor MS3b is connected between a drain of memory cell transistor MC3b and sub-bit line SBL3.

Cell select transistor MS4a is connected between a drain of memory cell transistor MC4a and sub-bit line SBL4. Cell select transistor MS4b is connected between a drain of memory cell transistor MC4b and sub-bit line SBL4.

Select gate SG3 opens and closes a connection between main bit line BL1 and sub-bit line SBL3. Select gate SG4 opens and closes a connection between main bit line BL2 and sub-bit line SBL4.

Gate electrodes of memory cell transistors MC3a and MC4a are both connected to word line WL3, and gate electrodes of memory cell transistors MC3b and MC4b are both connected to word line WL4.

Gate electrode layers of cell select transistors MS1a and MS2a are both connected to cell select line ML1. Gate electrode layers of cell select transistors MS1b and MS2b are both connected to cell select line ML2.

Gate electrode layers of cell select transistors MS3a and MS4a are both connected to cell select line ML3. Gate electrode layers of cell select transistors MS3b and MS4b are both connected to cell select line ML4.

Memory cell SG decoder 114 supplies a predetermined potential to one of cell select lines SL1–SL4 corresponding to the selected row.

Source decoder 207 adjusts a voltage on source line SL1 in the write, erase and read operations. Source decoder 208 adjusts a voltage on source line SL2 in the write, erase and read operations.

SG decoder 205 receives outputs of high voltage generating circuit 110 and negative voltage generating circuit 112 in accordance with internal address signal Ax sent from address buffer 102, and controls the gate potentials on corresponding select gates SG1–SG4 for selectively connecting the sub-bit lines to the main bit lines.

An operation of nonvolatile semiconductor memory device 200 will be briefly described below.

Program Operation

When data is to be written into the memory cell, address buffer 102 is supplied with address signals A0–Ai designating the address of the memory cell to be selected. Also, data I/O buffer 124 is supplied with data to be written. In accordance with this, data driver 126 drives the potential level on the corresponding bit line. Write circuit 130 receives write data from data driver 126 through bit line.

In the following description, it is assumed that the memory cells MC1a and MC1b in memory cell array block BLK0 are selected. First, erasing is effected on memory cells MC1a and MC1b in memory cell array block BLK0. More specifically, sub-bit line SBL1 is floated, and the high voltage generating circuit 110 and negative voltage generating circuit 112 generate the predetermined high and negative voltages, respectively, under the control by write/erase control circuit 122. In response to this, source decoder 207 sets a negative potential, e.g., of –8 V on the sources of memory cell transistors MC1a and MC1b in memory cell array block BLK0 through source line SL1. Well potential generating circuit 120 sets a negative potential, e.g., of –8 V, which is the same as the source potential of the memory cell transistor, on the well of the memory cell transistor.

Memory cell SG decoder 114 supplies a potential onto cell select lines ML1 and ML2. WL decoder 106 controlled by write/erase control circuit 122 supplies a high voltage, e.g., of 10 V, which is generated by high voltage generating circuit 110, onto word lines WL1 and WL2.

Thereby, electrons are injected into the floating gates of memory cell transistors MC1a and MC1b from the substrate side, and the threshold voltages of these memory cell transistors rise. Thereby, the erase operation is completed.

In the write operation, write circuit 130 drives the potential level on main bit line BL1 under the control by write/erase control circuit 122. More specifically, when data is to be written into only memory cell MC1a, source decoder 207 sets source line SL1 to the floating state. Well potential generating circuit 120 sets the well potential, e.g., to 0 V under the control by write/erase control circuit 122.

Memory cell SG decoder 114 supplies a predetermined potential onto cell select line ML1 corresponding to the selected row. WL decoder 106 controlled by write/erase control circuit 122 supplies the negative potential, e.g., of –8 V generated by negative voltage generating circuit 112 onto word line WL1. Write circuit 130 is also controlled by write/erase control circuit 122, and thereby sets the level on main bit line BL1 to a high potential, e.g., of 5 V based on the high voltage generated by high voltage generating circuit 110.

By applying the potentials to memory cell transistor MC1a as described above, electrons are extracted from the floating gate, and the threshold voltage of memory cell transistor MC1a changes.

When supply of the potentials is completed, nonvolatile semiconductor memory device 200 performs verification at write/erase control circuit 122 for verifying writing under the control by write/erase control circuit 122. When write/erase control circuit 122 determines that writing of data to be written into memory cell transistor MC1a is not completed, the potential for writing is applied to memory cell transistor MC1a again, and subsequently program verification is performed.

In this manner, predetermined data is written into selected memory cell transistor MC1a.

In the two-transistor type memory cell of the embodiment 3, only the memory cell transistor selected for writing can be connected to the main bit line by using the cell select transistor. Therefore, the write operation for one memory cell transistor does not affect the threshold voltages of the other memory cell transistors.

Read Operation

When data is to be read from the memory cell, address signals A0–Ai designating the address of the memory cell to be selected is applied to address buffer 102. Address buffer 102 issues internal row address signal Ax.

It is now assumed that memory cell transistor MC1a is to be selected. Memory cell SG decoder 114 supplies a predetermined potential onto cell select line ML1 corresponding to the row selected for reading in response to internal row address signal Ax. WL decoder 106 supplies a predetermined potential onto word line WL1 selected for reading in response to internal row address signal Ax. Further, main bit line BL1 and source line SL1 are supplied with predetermined potentials. Sense amplifier 128 senses change in potential on main bit line BL1 through column select gate SLG1.

Description will now be given on a read operation speed of nonvolatile semiconductor memory device 200 formed of the two-transistor type memory cells of the embodiment 3 together with a read operation speed of nonvolatile semiconductor memory device 100 of the embodiment 1 for comparison.

In the two-transistor type memory cell, the drive power of the cell select transistor becomes one of factors determining the read current. When external power supply voltage Vcc lowers, therefore, the read current may lower, and the read speed may lower.

In the read operation, the bit line capacity is charged with the read current, and an amount of change in bit line voltage is sensed (by sense amplifier circuits 128 in FIGS. 1 and 21) for determining whether the information of the memory cell is "1" or "0".

Even when the read current is low, therefore, a smaller bit line capacity can reduce a time for sensing after charging the bit line.

Bit line capacity CB0 in the NOR-type memory cell array of the embodiment 1 will be obtained with reference to FIG. 22. In FIG. 22, x1 represents the bit line parasitic capacity, x2 represents a diffusion layer capacity of the memory cell transistor, and x3 represents the number of memory cells connected to one bit line. Bit line capacity CB0 is equal to a sum of a total capacity x4 (=x2×x3÷2) of diffusion layer capacities x2 of the memory cell transistors and bit line parasitic capacity x1.

For example, as shown in FIG. 22, it is assumed that the bit line parasitic capacity x1 is 1 pF, diffusion layer capacity x2 of the memory cell transistor is 2 fF/cell, and the number x3 of memory cells connected to the same bit line is 2000. In this case, the total capacity x4 of the diffusion layer capacities of the memory cell transistors is 2 pF, and bit line capacity CB0 is 3 pF.

Thereby, a time t0 required for charging the bit line and sensing the amount of potential change on the bit line is 10 ns (=3 pF×0.2 V÷60 μA) when read current is 60 μA. In this calculation, it is assumed that the amount of change in bit line potential required for sensing is 0.2 V.

Then, a bit line capacity CB1 in the DINOR-type memory cell array of the embodiment 3 will be discussed with reference to FIGS. 23 and 24.

Figure 23:
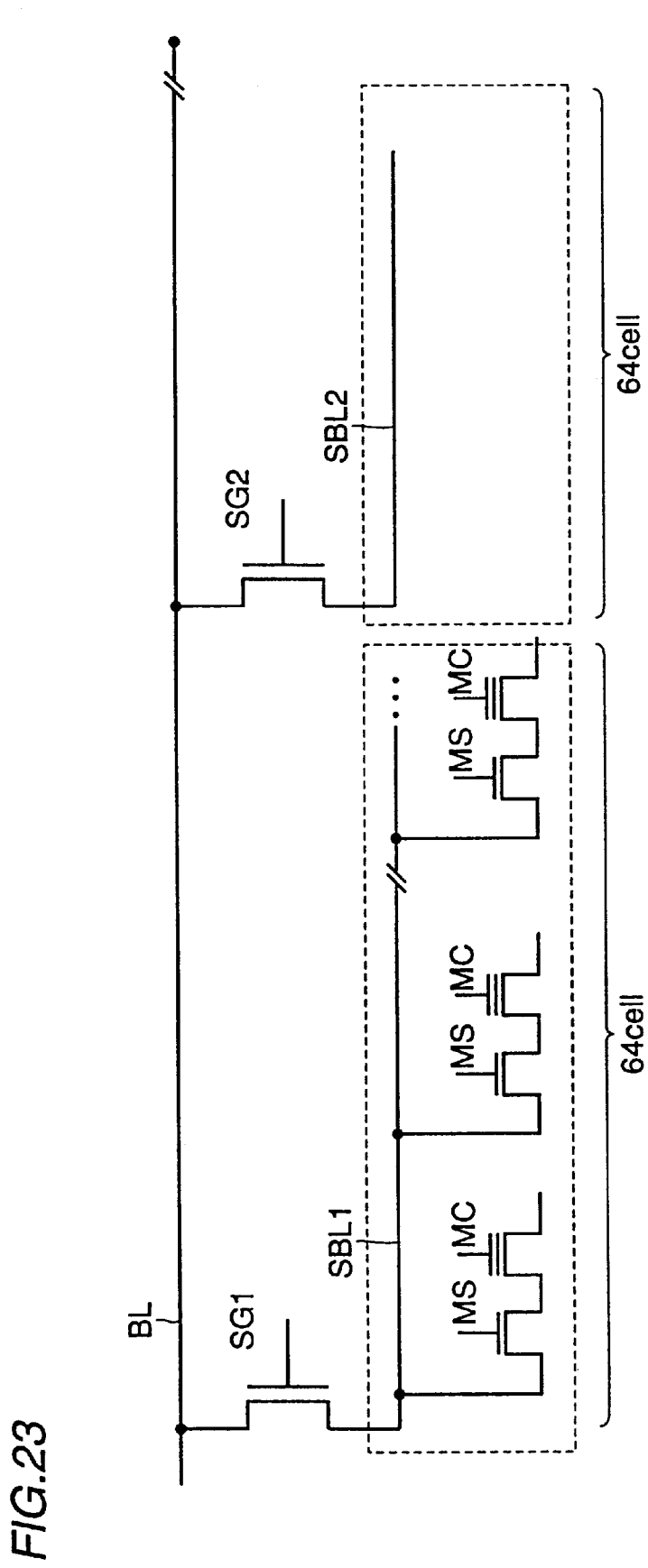
FIG. 23 is a circuit diagram for showing a bit line capacity of a DINOR-type memory cell array of an embodiment 3.

As shown in FIG. 23, the DINOR-type memory cell array of the embodiment 3 includes select gates SG1, SG2, . . . connected between memory cell transistors MC and main bit line BL.

In the read operation, select gates SG1, SG2, . . . open or close so that one of sub-bit lines SBL1, SBL2, . . . connected to the memory cell transistor to be selected is connected to main bit line BL.

It is now assumed that memory cell transistor MC on sub-bit line SBL1 is selected. Select gate SG1 is on, and select gate SG2 is off. Each of sub-bit lines SBL1, SBL2, . . . is connected to 64 memory cells. In this case, the memory cells which are selected and connected to main bit line BL are 64 in number.

FIG. 24 shows conditions for calculating bit line capacity CB1 in the DINOR-type memory cell array of the embodiment 3. In FIG. 24, x5 represents a main bit line parasitic capacity, x6 represents a sub-bit line parasitic capacity, x7 represents a diffusion layer capacity of the memory cell transistor, x8 represents the number of memory cells connected to one sub-bit line, and x10 represents a transistor capacity of the select gate. Bit line capacity CB1 is equal to the sum of a total amount x9 (=x7×8÷2) of diffusion layer capacities of memory cell transistors, main bit line parasitic capacity x5, sub-bit line parasitic capacity x6 and transistor capacity x10 of the select gate.

For example, as shown in FIG. 24, it is assumed that diffusion layer capacity x7 of the memory cell transistor is 2 fF/cell, and the number x8 of the memory cells connected to one sub-bit line is 64. In this case, total amount x9 of the diffusion layer capacities of the memory cell transistors is 0.06 pF. When main bit line parasitic capacity x5 is 1 pF, sub-bit line parasitic capacity x6 is 0.05 pF and the transistor capacity of the select gate is 0.2 pF, bit line capacity CB1 is 1.3 pF. Thus, bit line capacity CB1 is approximately equal to a half of bit line capacity CB0 of the NOR-type memory cell array of the embodiment 1.

In the DINOR-type memory cell array including the two-transistor type memory cells of the embodiment 3, therefore, the access speed does not lower even when the read current is 30 μA which is half a normal value of 60 μA.

Thus, the low-voltage operation and fast access operation can be performed in the DINOR-type memory cell array including the two-transistor type memory cells of the embodiment 3, because the access speed does not lower even with half the usual read current owing to reduction in bit line capacity, in spite of the fact that the drive power of the cell select transistor lowers and the read current also lowers in the low-voltage read operation.

In the embodiment 3, signal line L having a portion pile-driven to the gate electrode of the cell select transistor may be used for achieving fast driving of the cell select transistor, as is done in the embodiment 1. Thereby, the speed of access operation can be further increased.

A connection between the memory cell transistor and the cell select transistor may be of the source select type instead of the drain select type described above.

Embodiment 4

An operation of a nonvolatile semiconductor memory device of an embodiment 4 according to the invention will be described below.

The embodiment 4 will be described below in connection with another example of the write, erase and read operations of the nonvolatile semiconductor memory device 200 having the two-transistor type memory cells of the embodiment 3 already described.

In the two-transistor type memory cell, the cell select transistor is used to open and close a conduction path between the corresponding memory cell transistor and the bit line. Therefore, the lower limit of the threshold voltage distribution of the memory cell transistor may be lower than 0 V. Also, it is not necessary to narrow the threshold voltage distribution in a lower side.

Owing to this, a voltage (read voltage) applied to the control gate electrode of the memory cell transistor can be arbitrarily selected. The same voltage as the read voltage can be applied to the memory cell transistor during standby. Conditions for voltage application will be described below with reference to FIGS. 25 to 29.

FIGS. 25 and 26 show, by way of example, the conditions of various voltages applied to the two-transistor type memory cells in nonvolatile semiconductor memory device 200. FIG. 25 shows the conditions for the drain select type connection, and FIG. 26 shows the conditions for the source select type connection.

Figure 27:
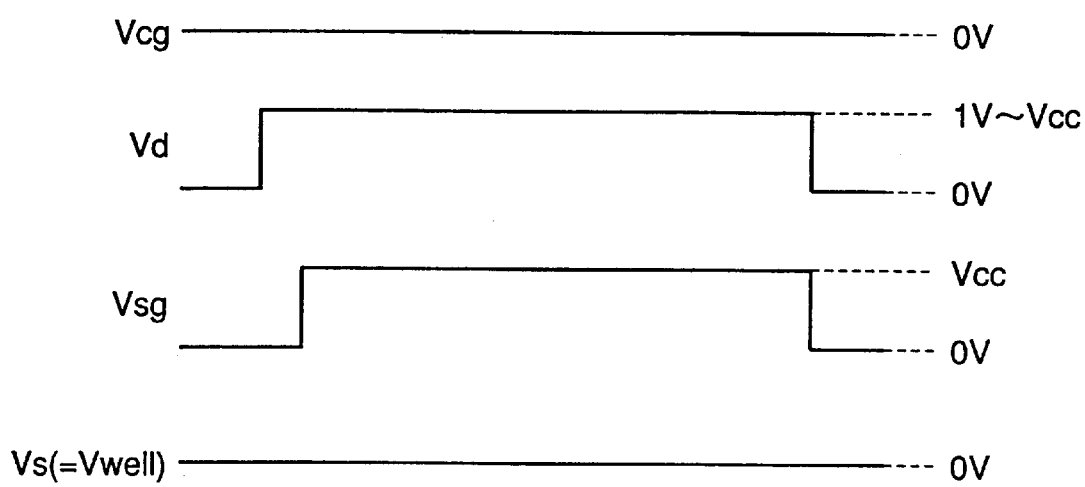
FIG. 27 is a timing chart showing a read operation corresponding to FIG. 25.
Figure 28:
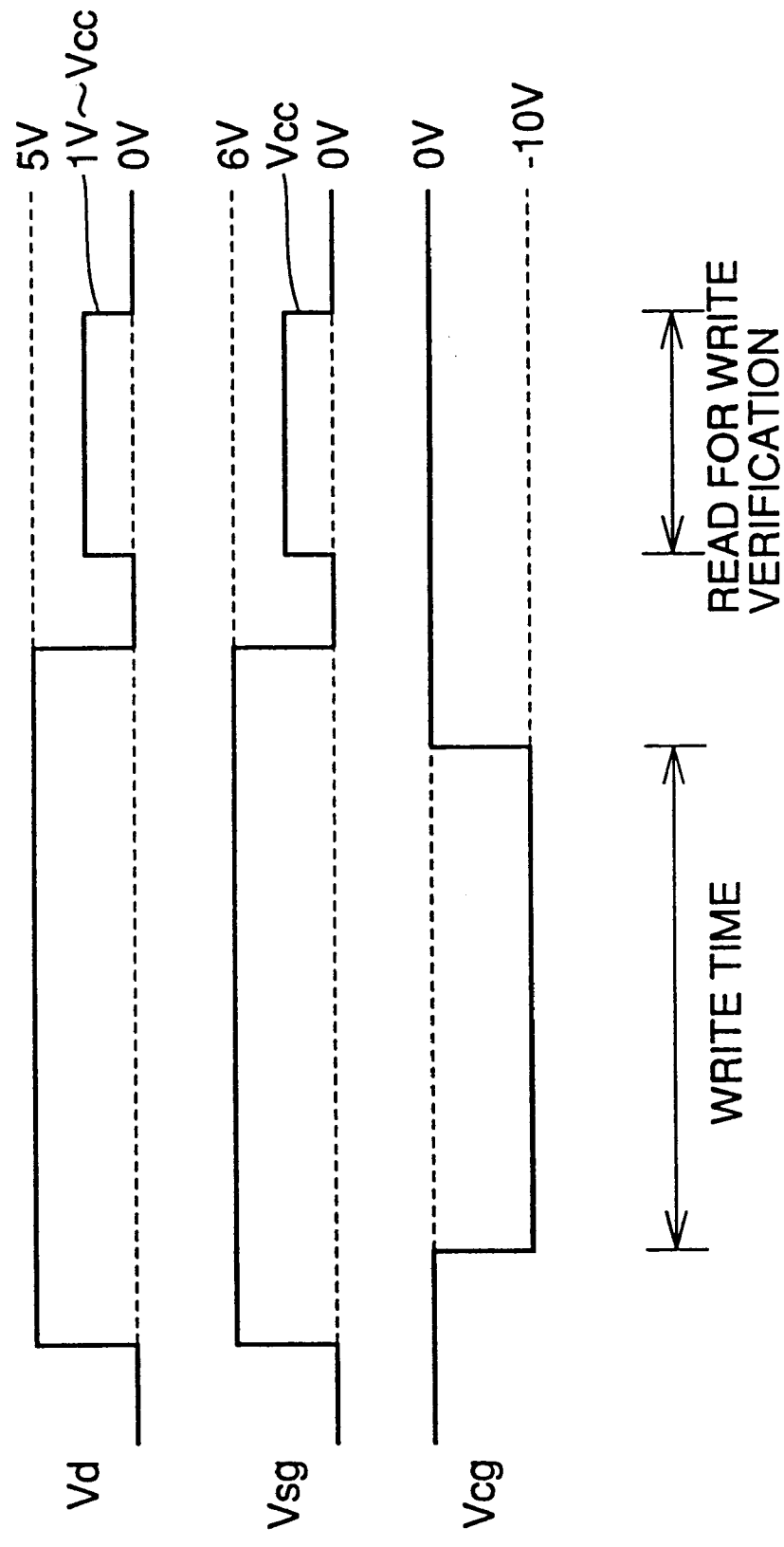
FIG. 28 is a timing chart showing a write operation corresponding to FIG. 25.
Figure 29:
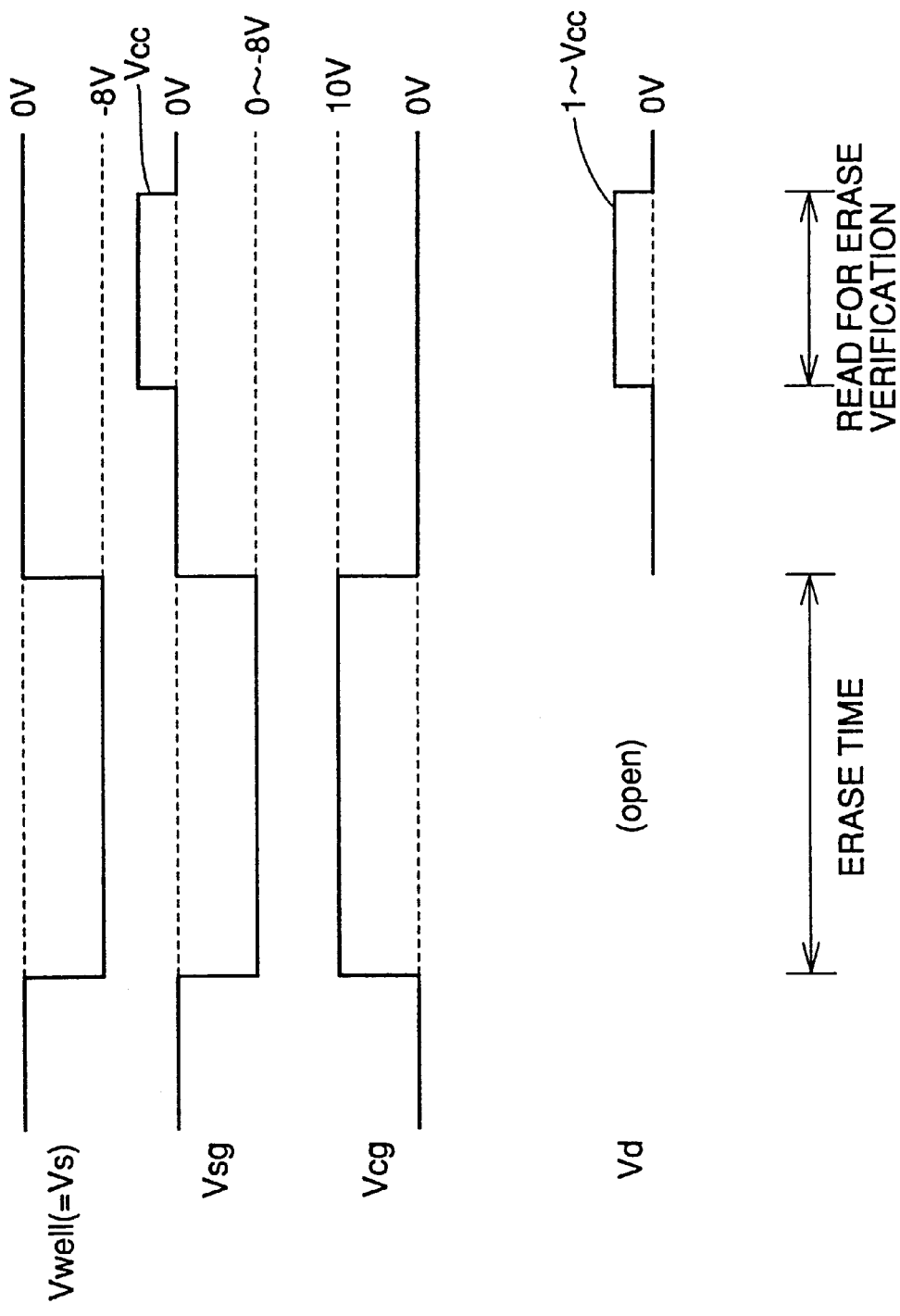
FIG. 29 is a timing chart showing an erase operation corresponding FIG. 25.

FIGS. 27 to 29 are timing charts showing various operations corresponding to FIG. 25. More specifically, FIG. 27 shows the read operation, FIG. 28 shows the write operation and FIG. 29 shows the erase operation.

Referring to FIGS. 25 to 29, Vcg represents the voltage applied to the control gate electrode of the memory cell transistor, and Vs represents the source voltage applied to the source region connected to the source line. Vd represents the drain voltage applied to the drain region connected to the bit line, and Vsg represents the gate voltage applied to the gate electrode of the cell select transistor. In FIGS. 25 and 26, external power supply voltage Vcc is 1.8 V.

Referring to FIGS. 25 and 27, voltage Vcg of control gate electrode of the memory cell transistor is set to 0 V during standby. In the read operation, the voltage applied to the control gate electrode of memory cell transistor is still 0 V. Drain voltage Vd is set to a value between 1 V and Vcc (e.g., 1.8 V). Source voltage Vs and well voltage Vwell are 0 V. Thereby, data is read from the memory cell transistor selected for reading.

In the write operation, as shown in FIGS. 25 and 28, drain voltage Vd is set to 5 V, and gate voltage Vsg of the corresponding cell select transistor is set to 6 V. Voltage Vcg of control gate electrode of the memory cell transistor is set to −10 V. Thereby, writing starts.

When the voltage Vcg on control gate electrode of the memory cell transistor is set to 0 V, the writing is finished.

Drain voltage Vd is set to a value between 1 V and Vcc (e.g., 1.8 V), and gate voltage Vsg of the corresponding cell select transistor is set to external power supply voltage Vcc (e.g., 1.8 V). Thereby, reading for write verification is performed.

In the conventional DINOR-type flash memory, an operation of applying a voltage in a pulse form and thereby extracting electrons and an operation of verifying the threshold voltage are performed for every bit, and the distribution in a low threshold voltage area is narrowed by repeating these operations. In the embodiment 4, however, it is not necessary to narrow the threshold voltage distribution so that it is not necessary to verify the writing for every pulse voltage by applying the voltage in the pulse form. Therefore, the write verification can be performed after performing the writing for a sufficiently long time.

Referring to FIGS. 25 and 29, description will be given on the erase operation in such a case that the well is divided correspondingly to every erase unit (sector). For the erase operation in this case, source voltage Vs and well voltage Vwell are set to −8 V, and the gate voltage Vsg of the corresponding cell select transistor is set to a value between 0 V and −8 V. Voltage Vcg on control gate electrode of the memory cell transistor is set to 10 V. Thereby, erasing starts.

When voltage Vcg on control gate electrode of the memory cell transistor is set to 0 V, the erase operation is finished.

When drain voltage Vd is set to a value between 1 V and Vcc (e.g., 1.8 V), and gate voltage Vsg of the corresponding cell select transistor is set to external power supply voltage Vcc (e.g., 1.8 V), reading for erase verification is performed.

Description will now be given on the erase operation in the case where well division is not employed. In this case, the memory cell array is formed in one well so that it is desirable to perform the erase operation without driving the well potential. Therefore, voltage Vcg on the control gate electrode is set to 18 V.

For the erase operation in this case, source voltage Vs and well voltage Vwell are first set to 0 V, and gate voltage Vsg of the corresponding cell select transistor is set to 0 V. Also, voltage Vcg on the control gate electrode of the memory cell transistor is set to 18 V. Thereby, erasing starts.

When voltage Vcg on the control gate electrode of the memory cell transistor is set to 0 V, the erase operation is finished.

When drain voltage Vd is set to a value between 1 V and Vcc (e.g., 1.8 V), and gate voltage Vsg of the corresponding cell select transistor is set to external power supply voltage Vcc (e.g., 1.8 V), reading for erase verification is performed.

In the case of the source select type connection shown in FIG. 26, it is not necessary to take into consideration the voltage drop at the cell select transistor during the write operation. During the write operation, the cell select transistor can be off (its source is open), and the gate voltage Vsg of the cell select transistor can be 0 V. This is the difference from the drain select type.

In nonvolatile semiconductor memory device 200 of the embodiment 4, the voltage on word line during the read operation, i.e., read voltage Vcg can be set to an arbitrary voltage, and thereby the write speed or erase speed can be adjusted.

Further, the same voltage as read voltage Vcg is held during standby so that it is required to charge only the gate voltage of the cell select transistor to a predetermined voltage for performing the read operation. Thus, the read operation can be performed without changing read voltage Vcg (i.e., voltage applied onto the word line). Therefore, the fast read operation can be performed without requiring pile-driving of the aluminum interconnection to the word line.

Embodiment 5

A nonvolatile semiconductor memory device of the embodiment 5 according to the invention will be described below.

According to the embodiment 5, a two-transistor type memory cell is similar to those forming the nonvolatile semiconductor memory devices of the embodiments 1 and 3, but employs a memory cell transistor formed of a transistor which has a source/drain punch through breakdown voltage smaller than a voltage applied to the drain during the write operation.

Figure 30:
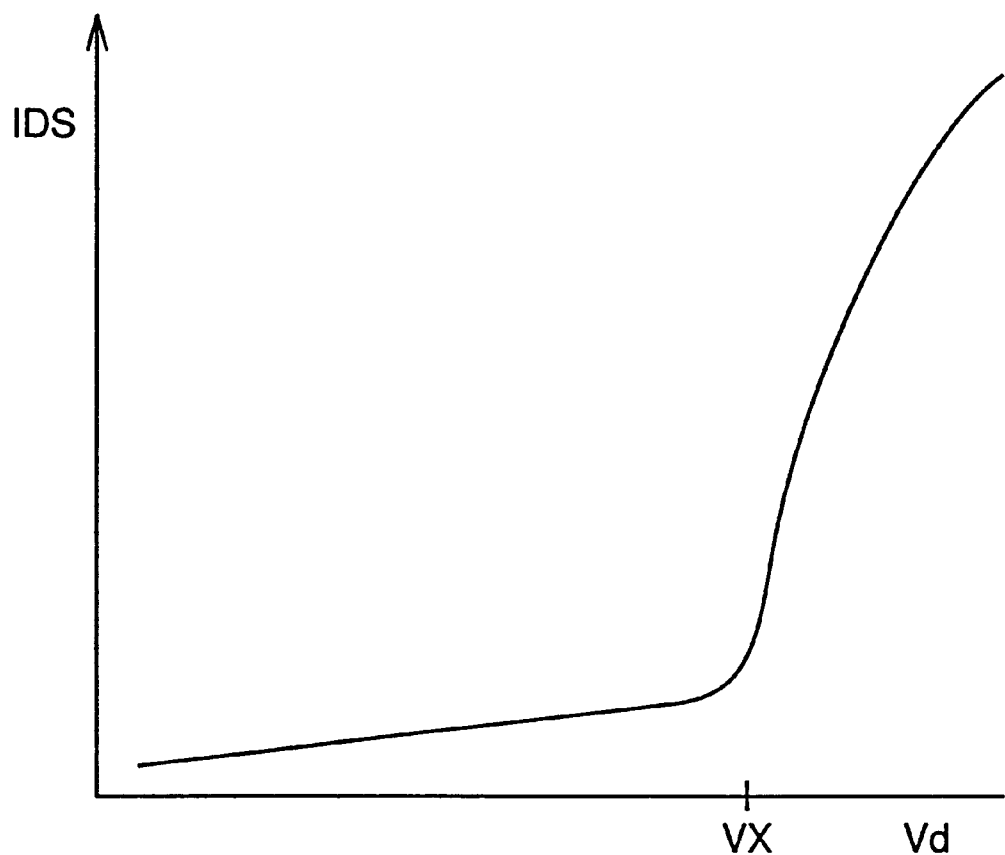
FIG. 30 shows a source/drain punch-through breakdown voltage.

In a device of a short channel, increase in drain-applied voltage, i.e., voltage applied to the drain causes a source/drain punch through phenomenon in which carriers escape through a region between the drain and source. The higher limit not causing this phenomenon is called a source/drain punch through breakdown voltage VX. As shown in FIG. 30, a source/drain current, i.e., a current flowing between the source and drain rapidly increases when the drain-applied voltage exceeds the source/drain punch through breakdown voltage VX.

It is now assumed that the source/drain punch through breakdown voltage VX is a value of the drain voltage which causes a source/drain punch through leak current of 1 nA with the well, source and gate voltages kept at the ground voltage.

Therefore, if the flash memory of the memory cell of the conventional one-transistor type employs a transistor having a source/drain punch through breakdown voltage smaller than drain-applied voltage Vd in the write operation, the source/drain current rapidly increases during the write operation, resulting in such a phenomenon that a leak current flows or a potential on an open source rapidly rises in an unselected memory cell (drain disturb cell) connected to the same bit line as the memory cell selected for writing.

When the above phenomenon occurs, the write operation cannot be performed normally. Therefore, it is impossible to use, as the memory cell, the transistor having source/drain punch through breakdown voltage VX which is smaller than drain-applied voltage Vd in the write operation, i.e., the transistor having a short gate length.

In the two-transistor type memory cell, however, each memory cell is connected to the cell select transistor dedicated to the same. Therefore, the cell select transistor can cut off the current even if the memory cell employs a transistor having source/drain punch through breakdown voltage VX smaller than the drain-applied voltage Vd in the write operation. Thus, even when the source/drain punch through occurs, this exerts no influence on the write operation.

By employing the structure of the two-transistor type memory cell, therefore, the memory cell transistor having a short gate length can be used, and the gate length can be miniaturized.

Embodiment 6

Figure 31:
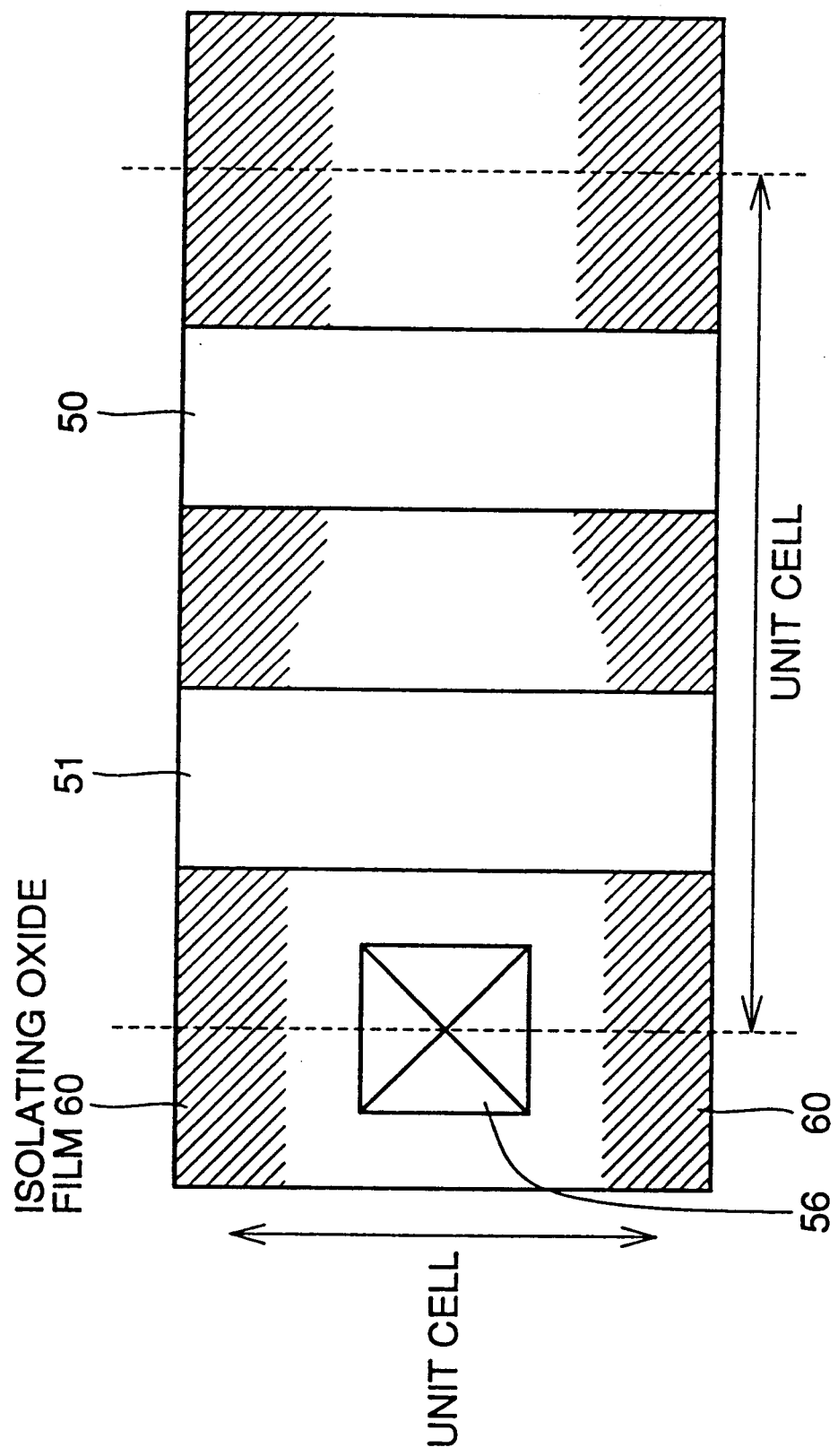
FIG. 31 is a plan of a two-transistor type memory cell of an embodiment 6.

A structure of a two-transistor type memory cell forming a nonvolatile semiconductor memory device of an embodiment 6 according to the invention will be described below with reference to FIG. 31.

In the memory cell of the two-transistor type forming the nonvolatile semiconductor memory device of the embodiment 6, an active region of the memory cell transistor portion has a smaller width than an active region of the cell select transistor portion as can be understood from a comparison with the structure of the embodiment 1 shown in the plan of FIG. 16.

Thereby, the voltage to be applied to the cell select transistor can be lowered.

A relationship between the active region width and the applied voltage will now be described below with reference to FIGS. 32 and 33.

Description will first be given on a tunnel oxide film electric field Eox in the erase operation. Since erasing is performed, all the source potential, drain potential and substrate potential in the memory cell transistor are equal. Therefore, if the quantity of charges in the memory cell transistor is 0, the following formula (1) is established by the law of electric charges.

$$0 = (Vcg - Vfg) \times Cono + (Vsub - Vfg) \times (Cs + Cd + Csub) \quad (1)$$

where Vcg represents the potential on the control gate electrode, and Vfg represents the potential on the floating gate electrode.

Figure 32:
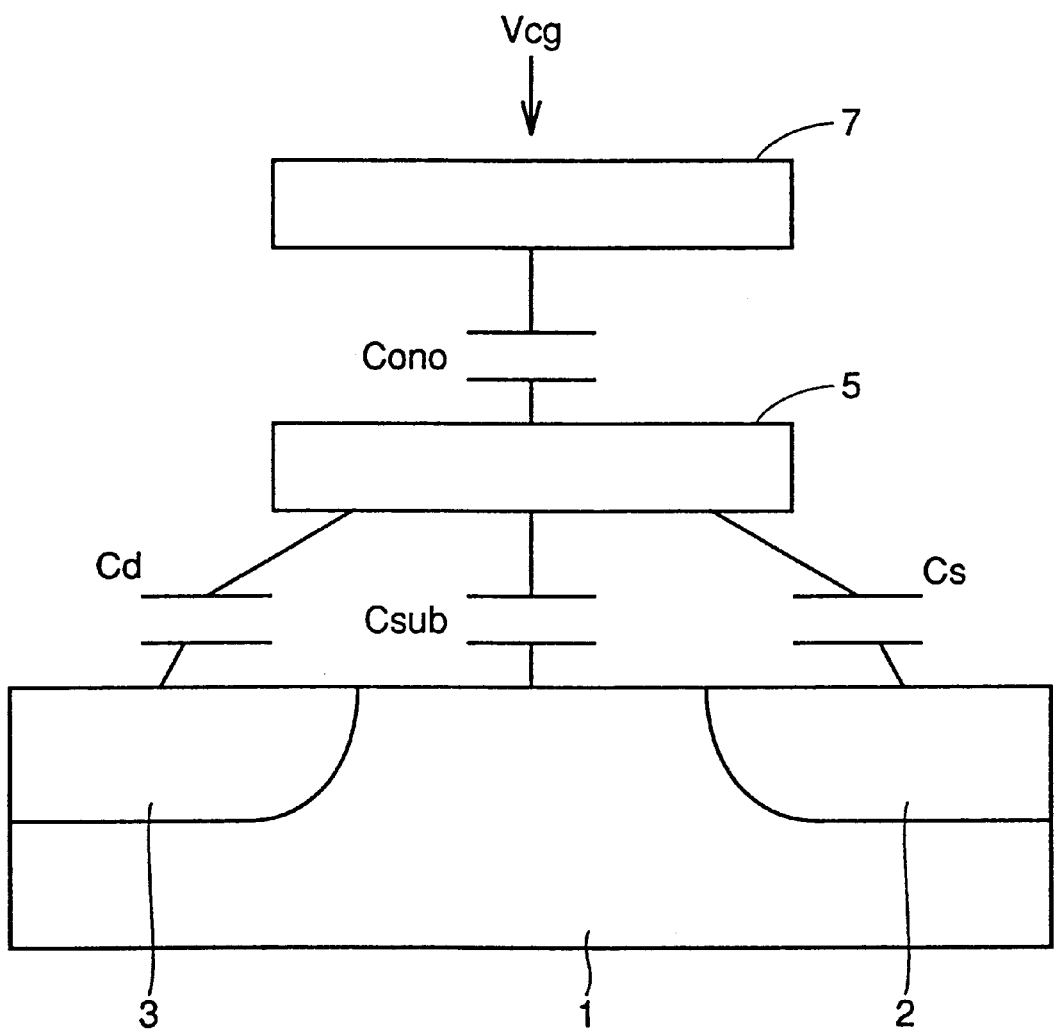
FIG. 32 shows a parasitic capacity of a transistor.
Figure 33:
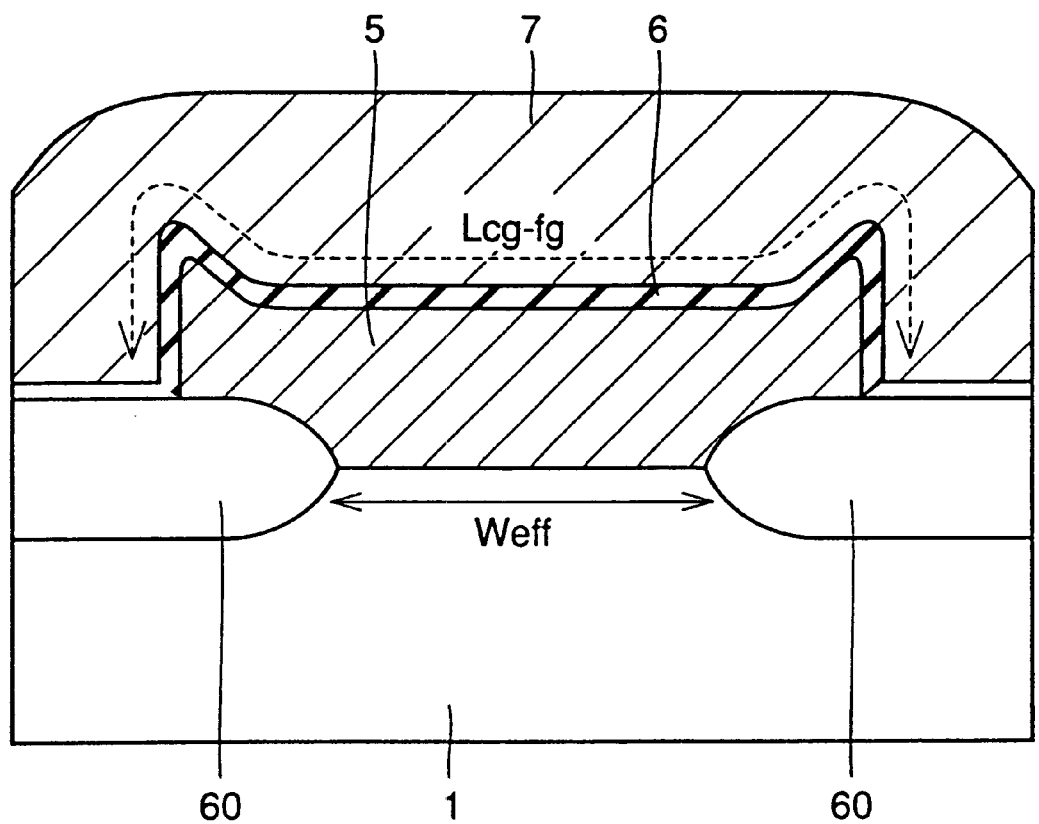
FIG. 33 shows an active region width of a transistor.

As shown in FIG. 32, Cono represents a capacity between control gate electrode 7 and floating gate electrode 5, and Csub represents a capacity between floating gate electrode 5 and substrate 1. Cd represents a capacity between floating gate electrode 5 and drain region 3, and Cs represents a capacity between floating gate electrode 5 and source region 2.

From the formula (1), relationships of the following formulas (2) and (3) are established.

$$acg = Cono/(Cono + Cd + Csub + Cs) \quad (2)$$

$$Vfg = acg \times Vcg + (1-acg) \times Vsub \quad (3)$$

where acg represents a coupling ratio.

Therefore, tunnel oxide film electric field Eox satisfies relationships of the following formulas (4) and (5)

$$Eox = |Vfg - Vsub|/tox \quad (4)$$

$$= acg \times |Vcg - Vsub|/tox \quad (5)$$

where tox represents the thickness of the tunnel oxide film. |Vcg-Vsub| represents the erase voltage.

From the foregoing, it can be understood that tunnel oxide film electric field Eox increases with coupling ratio acg. In accordance with this, erase voltage |Vcg-Vsub| can be reduced.

Capacity Cono and capacity (Cd+Csub+Cs) satisfy relationships of the following formulas (6) and (7).

$$Cono = Eox \times Lcg\text{-}fg \times L/teff \quad (6)$$

$$(Cd + Csub + Cs) = Eox \times Weff \times L/tox \quad (7)$$

where L represents the gate length, teff represents the thickness of ONO film in terms of oxide film thickness, and Weff represents the active region width. As shown in FIG. 33, Lcg-fg represents an overlapping length of control gate electrode 7 and floating gate electrode 5.

Accordingly, based on the formulas (2), (6) and (7), the following formula (8) for coupling ratio acg is satisfied.

$$acg = 1/\{1 + teff \times Weff/(tox \times Lcg\text{-}fg)\} \quad (8)$$

According to the formula (8), coupling ratio acg increases with decrease in active region width Weff.

From the relationships described above, erase voltage |Vcg-Vsub| can be reduced by reducing the active region width. Thus, the voltage required for erasing can be lowered.

Likewise, the write/erase voltage for the write operation can be lowered by reducing the active region width and thereby increasing coupling ratio acg.

For the cell select transistor, the current drive power of the cell select transistor can be increased by increasing the active region width, and thereby it is possible to lower the gate-applied voltage required for turning on the cell select transistor in the read operation and others. As shown in FIG. 31, therefore, these effects can be achieved at the same time by employing such a mask for forming the isolating oxide film that is small in the memory cell transistor portion and is large in the cell select transistor portion.

Embodiment 7

A structure of a nonvolatile semiconductor memory device of an embodiment 7 according to the invention will be described below.

In the embodiment 7, a memory cell of the two-transistor type forming a flash memory employs a memory cell transistor formed of a P-channel MOS transistor.

A structure of nonvolatile semiconductor memory device 300 of the embodiment 7 of the invention will now be described below with reference to FIG. 34.

Figure 34:
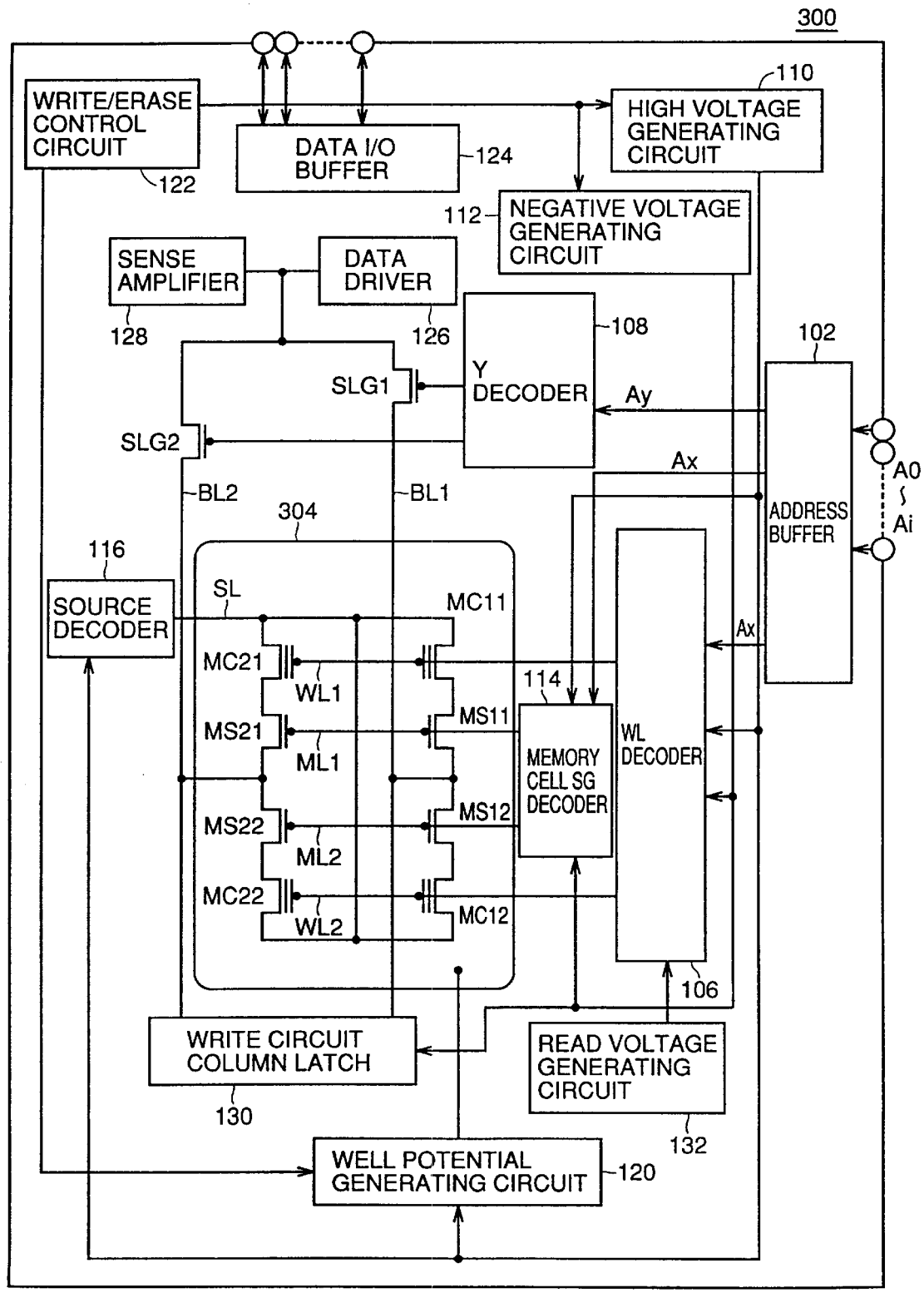
FIG. 34 is a schematic block diagram showing a structure of a nonvolatile semiconductor memory device 300 of an embodiment 7.

As shown in FIG. 34, nonvolatile semiconductor memory device 300 includes a memory cell array 304 in place of memory cell array 104 of the embodiment 1.

Memory cell array 304 is of the NOR-type, and includes a plurality of memory cell transistors MC and a plurality of cell select transistors MS. Memory cell transistor MC and cell select transistor MS are formed of P-channel MOS transistors.

FIG. 34 representatively shows memory cell transistors MC11, MC12, MC21 and MC22 as well as cell select transistors MS11, MS12, MS21 and MS22.

Gate electrodes of memory cell transistors MC11 and MC21 are both connected to word line WL1. Gate electrodes of memory cell transistors MC12 and MC22 are both connected to word line WL2.

Each of source regions of memory cell transistors MC11, MC12, MC21 and MC22 is connected to source line SL.

Cell select transistor MS11 is connected between bit line BL1 and the drain region of memory cell transistor MC11. Cell select transistor MS12 is connected between bit line BL1 and the drain region of memory cell transistor MC12. Cell select transistor MS21 is connected between bit line BL2 and the drain region of memory cell transistor MC21. Cell select transistor MS22 is connected between bit line BL2 and the drain region of memory cell transistor MC22.

Gate electrodes of cell select transistors MS11 and MS21 are both connected to cell select line ML1. Gate electrodes of cell select transistors MS12 and MS22 are both connected to cell select line ML2.

In nonvolatile semiconductor memory device 300, high voltage generating circuit 110 supplies high necessary voltages to WL decoder 106, well potential generating circuit 120 and source decoder 116. Negative voltage generating circuit 112 supplies a necessary negative voltage to WL decoder 106 and write circuit 130.

Well potential generating circuit 120 receives the output of high voltage generating circuit 110, and controls the well potential on the surface of the semiconductor substrate at which the memory cell transistor is formed. Write circuit 130 supplies a negative voltage generated by negative voltage generating circuit 112 onto the corresponding bit line.

WL decoder 106 receives the outputs of high voltage generating circuit 110 and negative voltage generating circuit 112. WL decoder 106 supplies a high voltage to the selected word line in the write operation, and supplies a negative voltage to the selected word line in the erase operation. Further, WL decoder 106 can receive an arbitrary read voltage generated by read voltage generating circuit 132.

Source decoder 116 receives the output of high voltage generating circuit 110, and sets the source potential of the memory cell transistor MC1 to the high potential through source line SL.

As disclosed in Japanese Patent Laying-Open No. 9-008153 (title: Nonvolatile Semiconductor Memory Device), a nonvolatile semiconductor memory device including a one-transistor type memory cell formed of a P-channel MOS transistor, a fast write operation is enabled by band-to-band tunnelling current induced hot electron injection (BBHE) writing.

For reference purposes, description will be given on a write operation for a conventional one-transistor type memory cell using an N-channel MOS transistor as a memory cell transistor with reference to FIG. 35, and is also given on a write operation for a conventional one-transistor type memory cell using a P-channel MOS transistor as a memory cell transistor with reference to FIG. 36.

FIG. 36 shows conditions for writing at the same speed as that in FIG. 35. In FIGS. 35 and 36, Vd represents a voltage applied to the drain region of the memory cell transistor, Vcg represents a voltage applied to the control gate electrode of the memory cell transistor, and tox represents a thickness of the tunnel oxide film of the memory cell transistor.

In the write operation of the structure in which the memory cell transistor is formed of the P-channel MOS transistor, holes which are generated together with electrons at the vicinity of the drain region by the band-to-band tunnelling current are pulled into the drain region, but do not become hot holes having a high energy because an energy is lost by the scattering caused by the fact that the density of holes is high in the drain region, as can be seen in the prior art. Even if hot holes were present, hot electrons would not be injected because the floating gate electrode carried a positive potential.

Therefore, injection of hot holes into the tunnel oxide film does not occur, and it is possible to prevent a problem of an N-channel MOS transistor in the prior art and, in other words, remarkable deterioration of the tunnel oxide film due to injection of hot electrons into the tunnel oxide film.

Thus, the P-channel MOS transistor has the foregoing features, and therefore is capable of performing fast writing with a low voltage. As compared with FIGS. 35 and 36, however, the P-channel MOS transistor cannot have an increased drain voltage Vd because a drain disturb margin must be kept, and therefore control gate electrode Vcg cannot be kept at a small value.

In connection with the above, description will be given on the write operation of the flash memory including the two-transistor type memory cells which use memory cell transistors formed of P-channel MOS transistors with reference to FIGS. 37 and 38.

Figures 37, 38, 39:
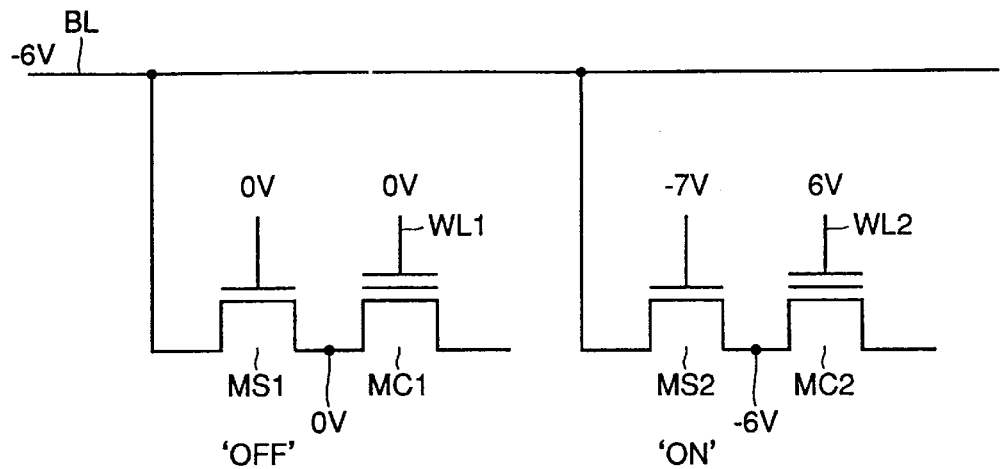
FIG. 37 shows, by way of example, a structure and voltage application conditions of a memory cell of a drain select type connection using a P-channel MOS transistor.
FIG. 38 shows, by way of example, conditions and a write speed in a write operation of a two-transistor type memory cell using a P-channel MOS transistor.
FIG. 39 shows voltage conditions of various voltages applied to a two-transistor type memory cell employing a connection of a drain select type in an embodiment 8.

FIG. 37 shows by way of example a structure of a memory cell of a drain select type connection using a P-channel MOS transistor as well as conditions for voltage application. FIG. 38 shows, by way of example, conditions for write operation of the two-transistor type memory cell using a P-channel MOS transistor and a write speed.

FIG. 37 representatively shows memory cell transistors MC1 and MC2 as well as cell select transistors MS1 and MS2.

Description will be given on the case where memory cell transistor MC2 is selected in the write operation. In this case, a negative voltage (−7 V) is applied to the gate of cell select transistor MS2. The gate voltage of cell select transistor MS1 remains at 0 V.

In the write operation, when a negative voltage (−6 V) is applied onto the bit line, the drain region of memory cell transistor MC2 attains the potential of −6 V as a result of subtraction of the threshold voltage.

Meanwhile, the drain of unselected memory cell transistor MC1 on the same bit line BL carries 0 V, and is not supplied with the write voltage (−6 V). Thus, drain disturb does not occur.

In the two-transistor type memory cell using the P-channel MOS transistor as the memory cell transistor, bias setting shown in FIG. 38 is allowed. More specifically, the voltage in the write operation can be lowered to ±6 V in contrast to the conventional one-transistor type memory cell using the P-channel MOS transistor shown in FIG. 36.

Although application to the NOR-type flash memory shown in FIG. 34 has been described, it can also be applied to the DINOR-type flash memory.

The connection between the memory cell transistor and the cell select transistor may be of the source select type instead of the drain select type already described.

Embodiment 8

An operation of a nonvolatile semiconductor memory device of an embodiment 8 according to the invention will be described below.

The embodiment 8 will be described below in connection with another example of the write, erase and read operations in nonvolatile semiconductor memory device 300 having the two-transistor type memory cell in the embodiment 7 which uses the P-channel MOS transistor as the memory cell transistor.

In the two-transistor type memory cell, the cell select transistor is used to open and close the conduction path between the corresponding memory cell transistor and the bit line. Therefore, the lower limit of the threshold voltage distribution of the memory cell transistor may be 0 volt or less. Also, it is not necessary to narrow the low threshold voltage distribution.

Owing to the above, it is possible to select arbitrarily the voltage (read voltage) applied to the control gate electrode of the memory cell transistor. Further, it is possible to apply the same voltage as the read voltage to the memory cell transistor during standby.

FIGS. 39 and 40 show, by way of example, voltage conditions of various voltages applied to the two-transistor type memory cell in nonvolatile semiconductor memory device 300. FIG. 39 shows the conditions for the drain select type, and FIG. 40 shows the conditions for the source select type. Vcg represents the voltage applied to the control gate electrode of the memory cell transistor, and Vs represents the source voltage applied to the source region connected to the source line. Vd represents the drain voltage applied to the drain region connected to the bit line, and Vsg represents the gate voltage applied to the gate electrode of the cell select transistor. Description will now be given particularly in connection with the connection of the drain select type with reference to FIG. 39.

During standby, voltage Vcg on the control gate electrode of the memory cell transistor is set to 0 V. In the read operation, the voltage applied to the control gate electrode of the memory cell transistor remains at 0 V.

Drain voltage Vd is set to a value between −V and −1.8 V. Gate voltage Vsg of the corresponding cell select transistor is set to −1.8 V. Source voltage Vs and well voltage Vwell are 0 V. Thereby, data is read from the memory cell transistor selected for reading.

In the write operation, drain voltage Vd is set to −5 V, and gate voltage Vsg of the corresponding cell select transistor is set to −6 V. Voltage Vcg on the control gate electrode of the memory cell transistor is set to 10 V. Thereby, the writing starts.

When voltage Vcg on control gate electrode of the memory cell transistor is set to 0 V, the writing is finished.

In the conventional DINOR-type flash memory, an operation of applying a voltage in a pulse form and thereby extracting electrons and an operation of verifying a threshold voltage are performed for every bit, and the distribution in a low threshold voltage area is narrowed by repeating these operations. In the embodiment 8, however, it is not necessary to narrow the threshold voltage distribution so that it is not necessary to apply the voltage in the pulse form and verify the writing for every pulse voltage. Therefore, the write verification can be performed after performing the writing for a sufficiently long time.

Description will now be given on the erase operation in such a case that the well is divided correspondingly to every erase unit (sector). For the erase operation in this case, source voltage Vs and well voltage Vwell are set to −8 V, and the gate voltage Vsg of the corresponding cell select transistor is set to a value between 0 V and 8 V. Voltage Vcg on control gate electrode of the memory cell transistor is set to −10 V. Thereby, erasing starts.

When voltage Vcg on control gate electrode of the memory cell transistor is set to 0 V, the erase operation is finished.

Then, description will be given on the erase operation in the structure wherein the well is not divided. Since the whole memory cell array is formed in one well, it is desired to perform the erase operation without driving the well potential. Therefore, voltage Vcg on the control gate electrode of the memory cell transistor is set to −18 V.

For the erase operation in this case, source voltage Vs and well voltage Vwell are first set to 0 V, and gate voltage Vsg of the corresponding cell select transistor is set to 0 V. Also, voltage Vcg on the control gate electrode of the memory cell transistor is set to −18 V. Thereby, erasing starts.

When voltage Vcg on the control gate electrode of the memory cell transistor is set to 0 V, the erase operation is finished.

In the case of the source select type connection shown in FIG. 40, it is not necessary to take into consideration the voltage drop at the cell select transistor during the write operation. During the write operation, the cell select transistor can be off (its source is open), and the gate voltage Vsg of the cell select transistor can be 0 V. This is the difference from the drain select type.

In nonvolatile semiconductor memory device 300 of the embodiment 8, the voltage on the word line during the read operation, i.e., read voltage Vcg can be set to an arbitrary voltage, and thereby the write speed or erase speed can be adjusted.

Further, the same voltage as read voltage Vcg is held during standby so that it is required to charge only the gate voltage of the cell select transistor to a predetermined voltage for performing the read operation. Thus, the read operation can be performed without changing read voltage Vcg (i.e., voltage applied onto the word line). Therefore, the fast read operation can be performed without requiring pile-driving of the aluminum interconnection to the word line.

Although application to the NOR-type flash memory has been described, it can also be applied to the DINOR-type flash memory.

Embodiment 9

An operation of a nonvolatile semiconductor memory device of an embodiment 9 according to the invention will be described below.

The embodiment 9 will be described below in connection with another example of the operation in nonvolatile semiconductor memory device 300 having the two-transistor type memory cell already described as the embodiment 7.

In the embodiment 9, application of external power supply voltage Vcc to the whole well during standby is allowed owing to use of P-channel MOS transistors for forming the two-transistor type memory cells.

Conditions for voltage application to the two-transistor type memory cell of the embodiment 9 will be described below, by way of example, with reference to FIG. 41 as well as FIG. 42 which is an operation timing chart corresponding to FIG. 41.

Figure 42:
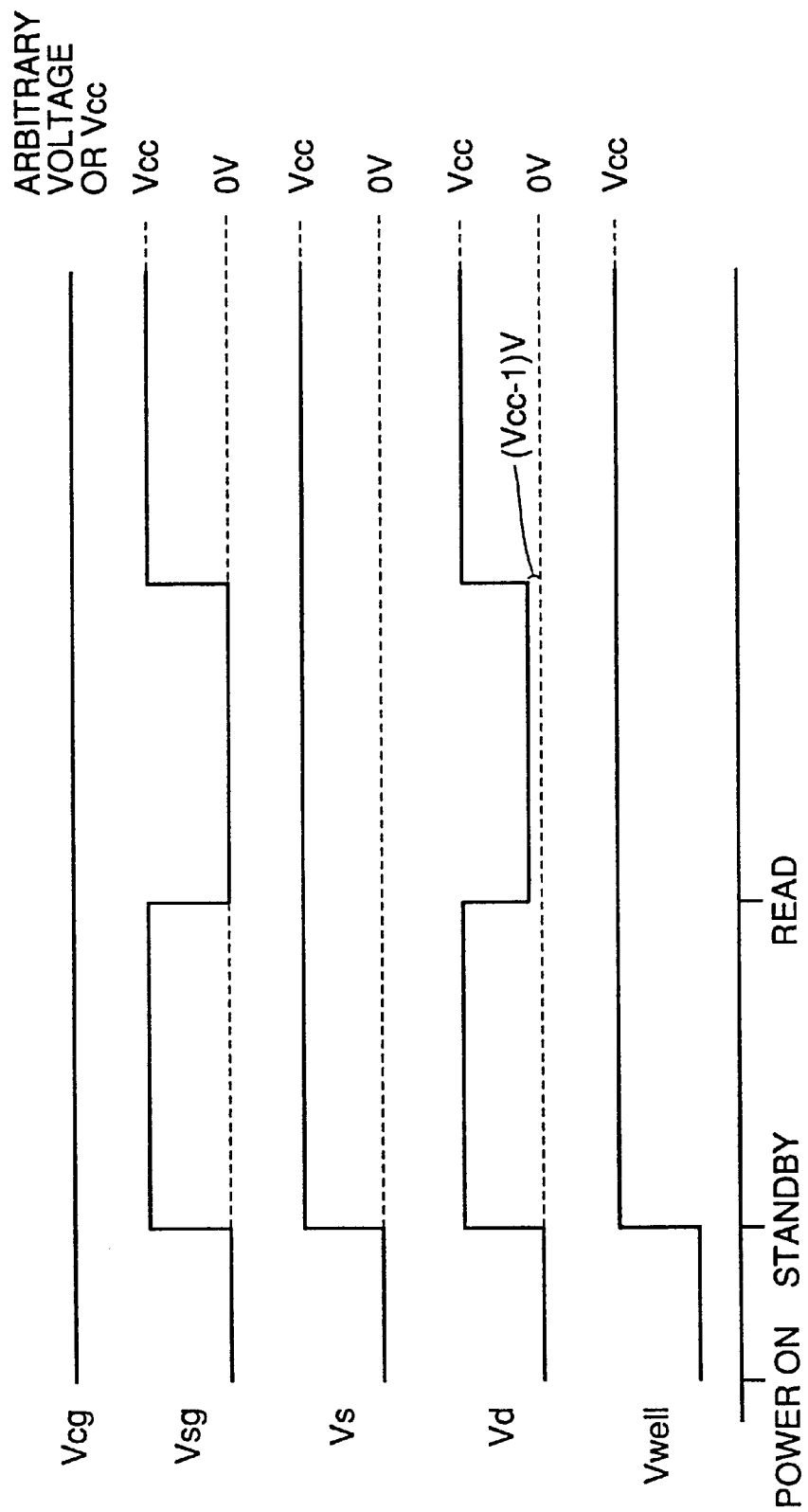
FIG. 42 is a timing chart of a read operation of the two-transistor type memory cell corresponding to FIG. 41.
Figure 43:
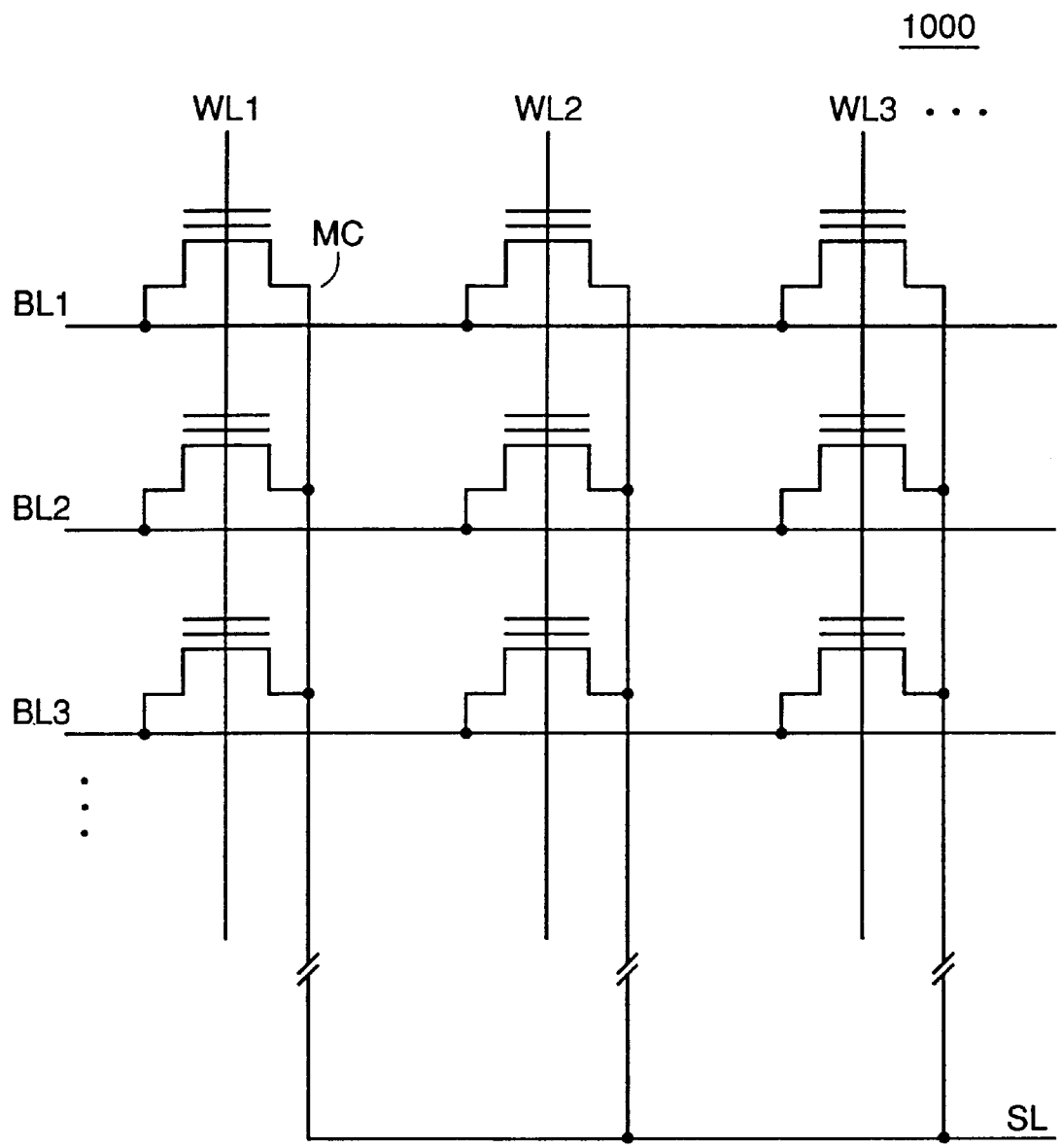
FIG. 43 is a circuit diagram showing a structure of a memory cell array in a NOR-type flash memory in the prior art.
Figure 44:
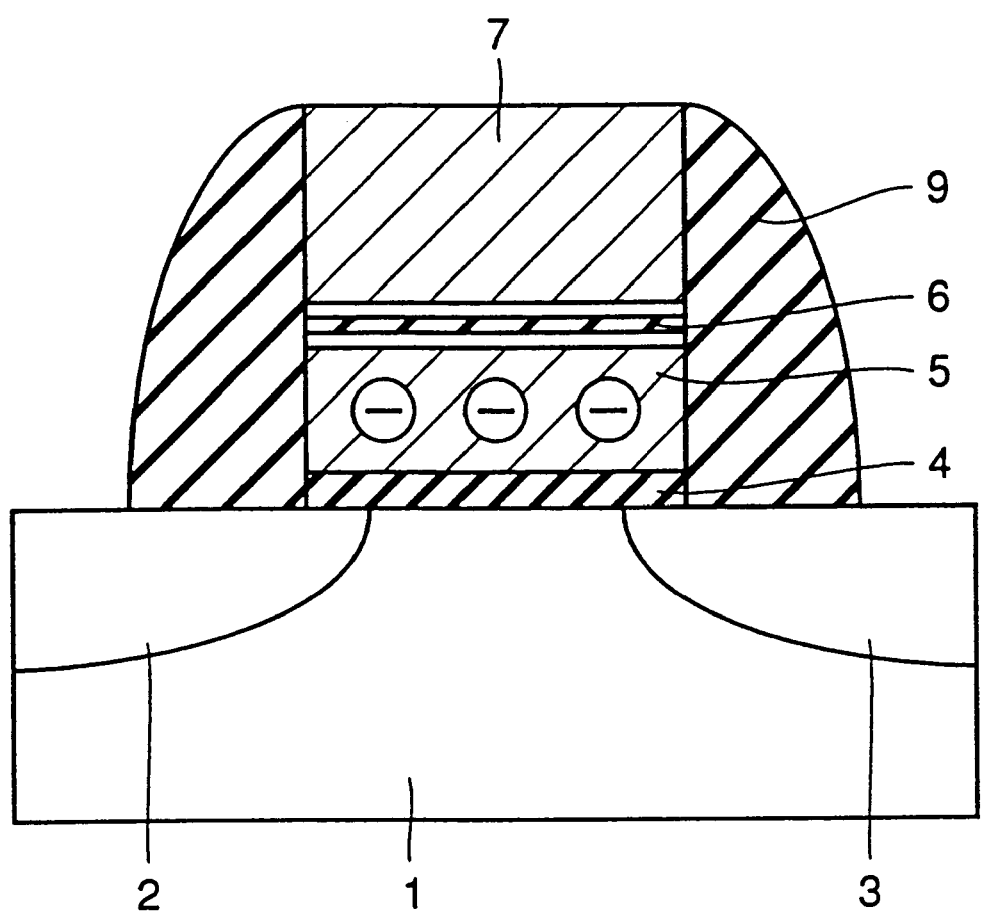
FIG. 44 is a sectional diagram showing a structure of a memory cell transistor in a nonvolatile semiconductor memory device in the prior art.
Figure 45:
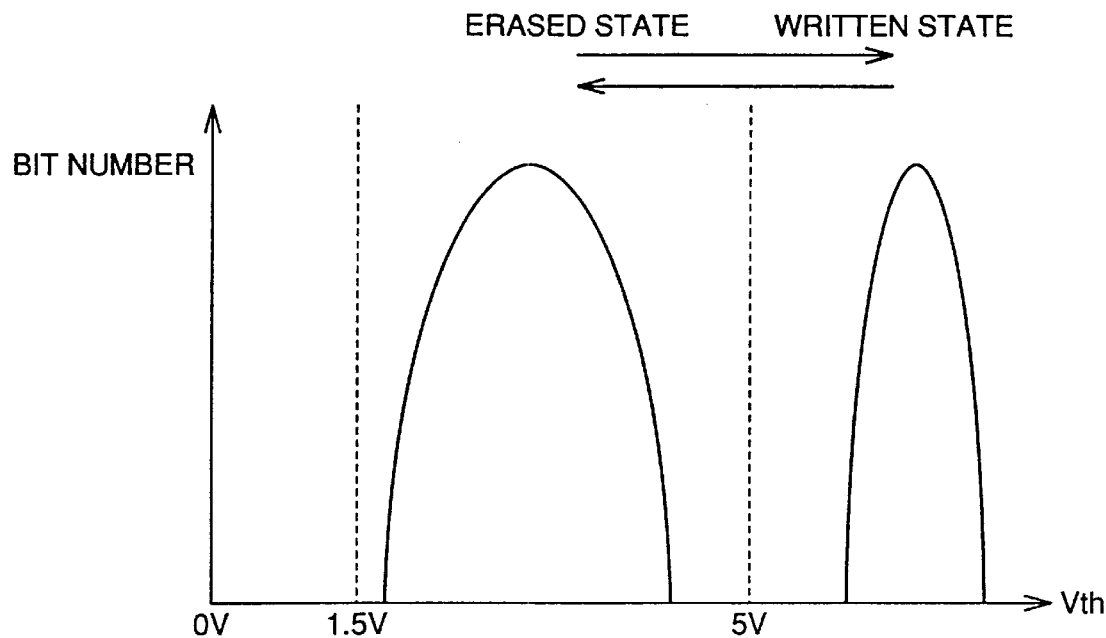
FIGS. 45 and 46 show threshold voltage distributions of the memory cell transistor in a conventional NOR-type flash memory in the prior art.
Figure 46:
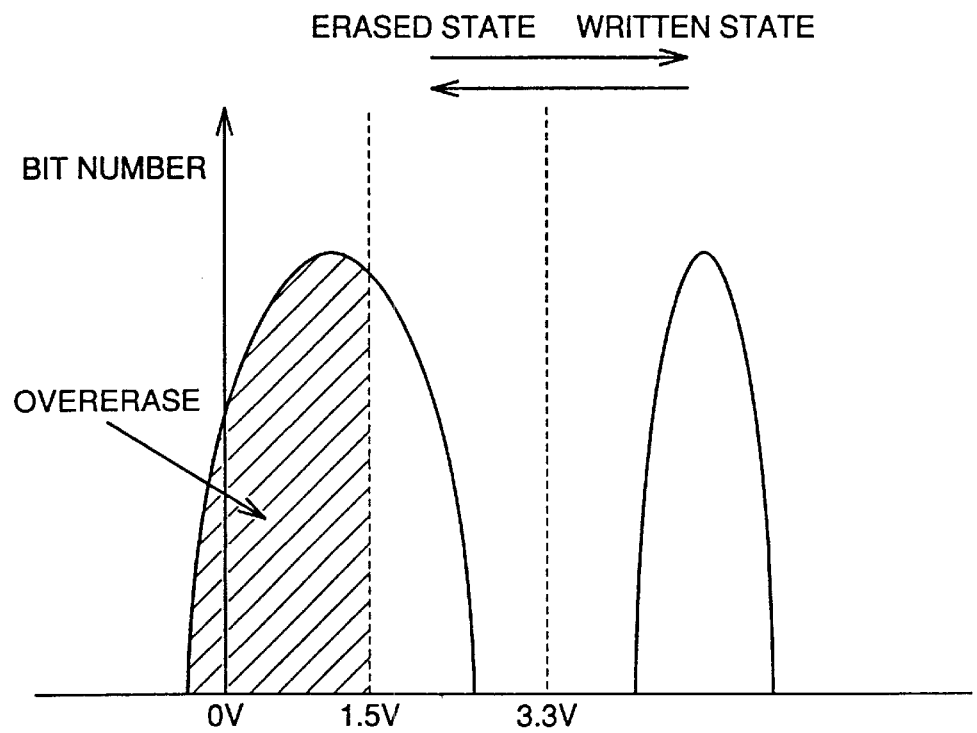
Figure 47:
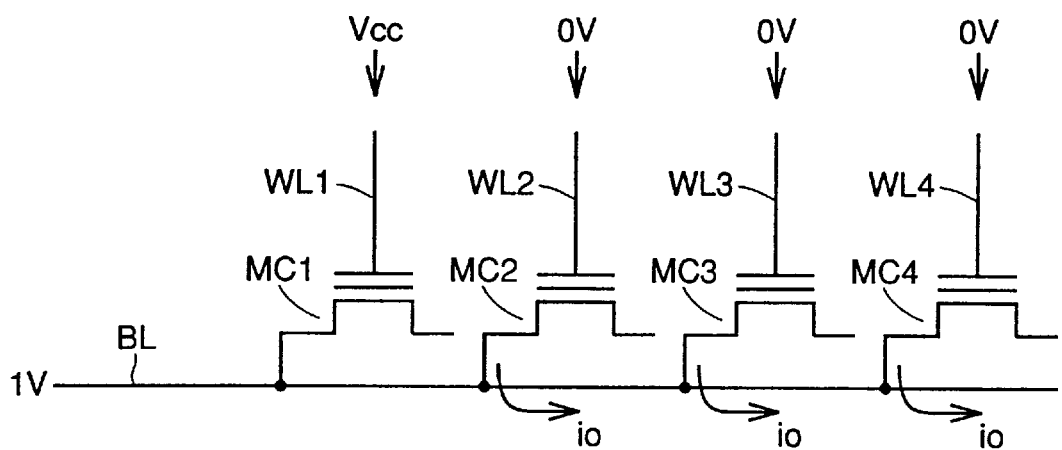
FIG. 47 shows a problem of an overerased cell in the NOR-type flash memory in the prior art.
Figure 48:
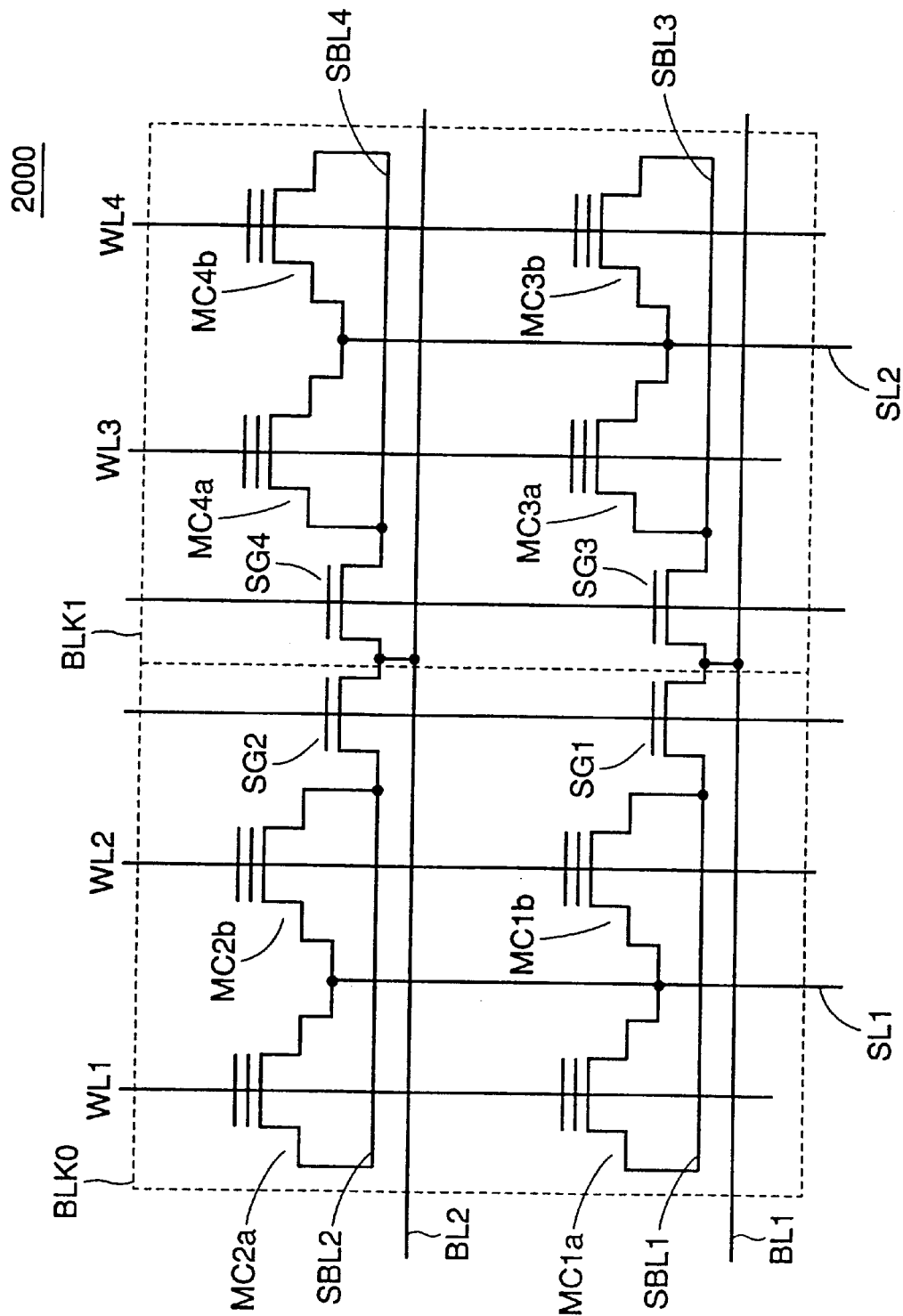
FIG. 48 is a circuit diagram showing a memory structure of a DINOR-type flash memory in the prior art.
Figure 49:
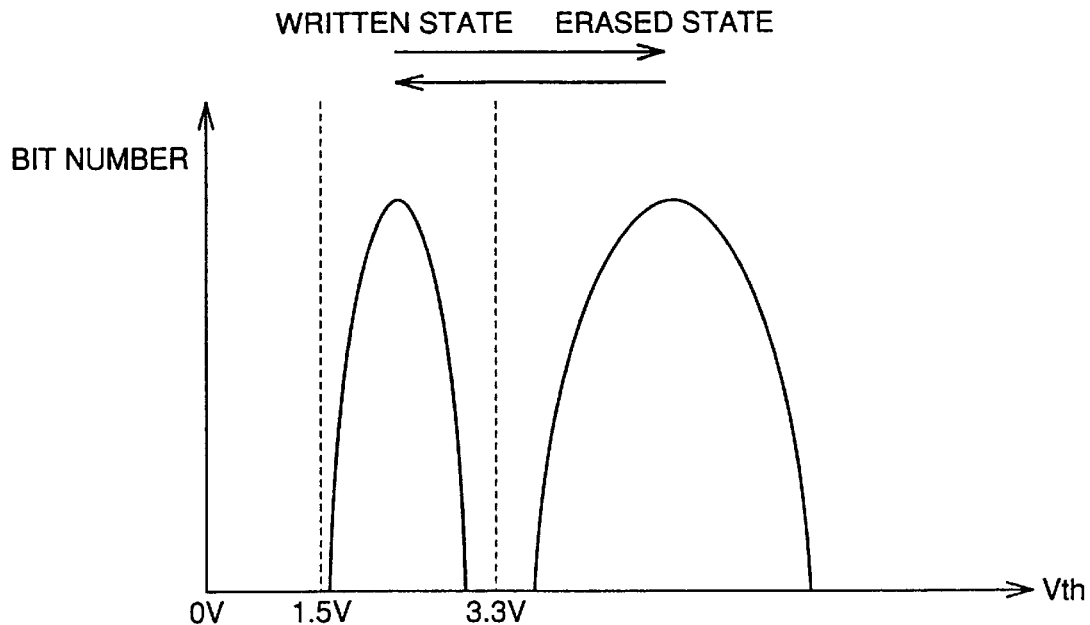
FIGS. 49 and 50 show threshold voltage distributions of a memory cell transistor in the DINOR-type flash memory in the prior art.
Figure 50:
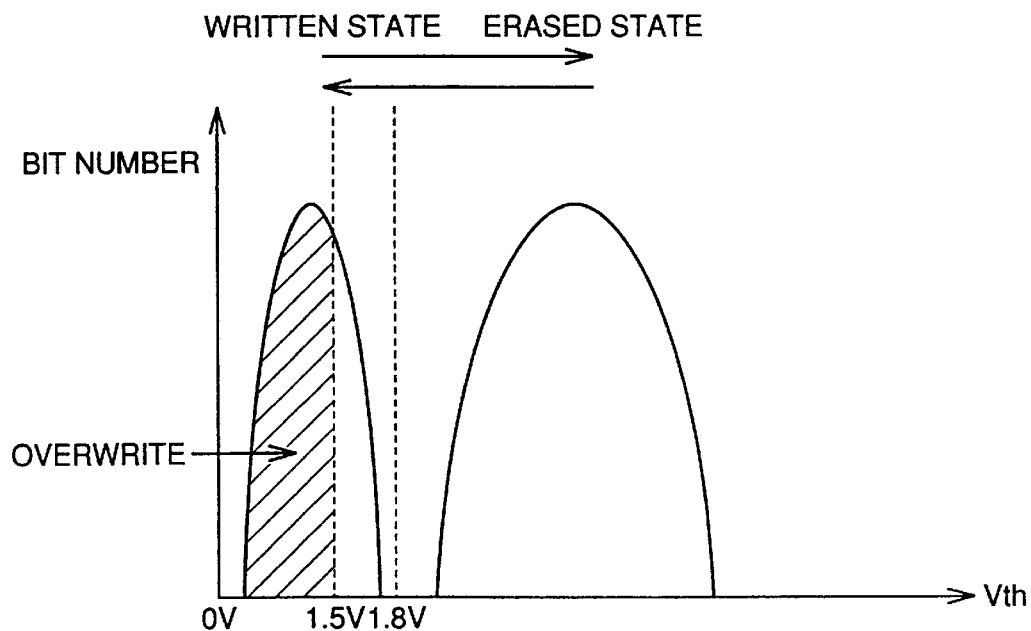

As shown in FIGS. 41 and 42, control gate voltage Vcg of the memory cell transistor is set, e.g., to external power supply voltage Vcc during standby and read operation.

During standby, well potential Vwell on the well including all the memory cell transistors and the cell select transistors is set to external power supply voltage Vcc.

In the read operation, gate voltage Vsg of the cell select transistor is set to 0 V.

Thus, external power supply voltage Vcc can be applied to the whole well including the memory cells during standby owing to the structure that the two-transistor type memory cells are formed of the P-channel MOS transistors. As a result, the negative voltage is not necessary, and the operation with external power supply voltage Vcc is allowed.

Since the whole well carries external power supply voltage Vcc during standby, the access speed for reading can be increased.

Although application to the NOR-type flash memory has been described, it can also be applied to the DINOR-type flash memory.

In the nonvolatile semiconductor memory device according to the invention, as described above, the memory cell (two-transistor type memory cell) is formed of the electrically writable and erasable memory cell transistor and the cell select transistor controlling a current flowing between the bit line and the source line through the memory cell transistor. Thereby, it is possible, in the read operation, to avoid flow of a leak current from the unselected memory cell connected to the same word line as the selected memory cell so that a malfunction due to overerasing or overwriting can be prevented, and the operation with a low voltage can be performed. Since on/off of the cell select transistor are controlled with the pile-driven metal interconnection, a fast operation can be achieved.

By setting the read voltage to an arbitrary value, the write or erase speed can be adjusted. By keeping the same voltage as the read voltage during standby, the fast reading operation can be performed without employing pile-driving of an aluminum interconnection to the word line.

By dividing the bit lines forming the memory cell array DINOR-type, it is possible to prevent the write operation of one of the memory cell array blocks from affecting the threshold voltages of the memory cell transistors of the other memory cell array blocks.

Since the P-channel MOS transistor is used for forming the two-transistor type memory cell, the positive voltage can be applied to the whole well during standby. Since the whole well can carry the positive voltage during standby, the fast reading operation can be performed. The fast write operation can also be performed owing to the band-to-band tunnelling current induced hot electron injection writing with the P-channel MOS transistor used as the memory cell transistor.

According to the two-transistor type memory cell described above, the memory cell transistor and the cell select transistor are formed in the same step so that these transistors can be formed with the minimum design rule internal.

According to the two-transistor type memory cell described above, the memory cell transistor has the gate width smaller than that of the cell select transistor. Thereby, the write and erase voltages can be lowered in the memory cell transistor. Also, in the cell select transistor, the current drive power can be increased, and the gate-applied voltage required for turn-on in the read operation can be lowered.

According to the two-transistor type memory cell described above, the memory cell transistor in which the source/drain punch through phenomenon can occur is used so that the gate length can be miniaturized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device formed on a semiconductor substrate, comprising:
   a plurality of memory cells arranged in a plurality of rows and a plurality of columns;
   a plurality of word lines arranged correspondingly to said plurality of rows, respectively;
   a plurality of bit lines arranged correspondingly to said plurality of columns, respectively;
   a source line supplying a first potential;
   each of said plurality of memory cells including:
      a memory cell transistor, and
      a MOS transistor;
   each of said memory cell transistors including:
      a control gate carrying a potential controlled by corresponding one of said word lines,
      a source and a drain to be connected and disconnected together under the control by said potential on said control gate and
      a floating gate;
   each of said MOS transistors selectively opening and closing a conduction path of a current flowing between said bit line and said source line through said corresponding memory cell transistor;
   said plurality of MOS transistors belonging to the same row commonly using a gate layer;
   said nonvolatile semiconductor memory device further comprising:
      a plurality of metal interconnections corresponding to the same rows;
      each of said plurality of metal interconnections being arranged above corresponding one of said gate layers with an insulating film having a plurality of connection holes therebetween;
      each of said metal interconnections being connected to corresponding one of said gate layers through the corresponding one of said connection holes; and
      switch select means for selectively supplying a potential to each of said metal interconnections in response to an external address signal.

2. The nonvolatile semiconductor memory device according to claim 1, further comprising:
   row select means for selecting one of said word line in response to the external address signal;
   column select means for selecting one of said bit line in response to the external address signal; and
   write and erase means for injecting or extracting electrons into or from the floating gate of a selected memory cell transistor.

3. The nonvolatile semiconductor memory device according to claim 2, further comprising read means for reading data from the selected memory cell transistor, wherein
   said row select means supplies a second voltage to said corresponding word line in the operation of reading data from said memory cell transistor, and supplies a third voltage to said plurality of word lines during standby, and
   said second voltage is equal to said third voltage.

* * * * *